(12) United States Patent
Chen et al.

(10) Patent No.: US 7,572,647 B2
(45) Date of Patent: Aug. 11, 2009

(54) INTERNAL BALANCED COIL FOR INDUCTIVELY COUPLED HIGH DENSITY PLASMA PROCESSING CHAMBER

(75) Inventors: Robert Chen, Fremont, CA (US); Canfeng Lai, Fremont, CA (US); Xinglong Chen, San Jose, CA (US); Weiyi Luo, Fremont, CA (US); Zhong Qiang Hua, Saratoga, CA (US); Siqing Lu, San Jose, CA (US); Muhammad Rasheed, Fremont, CA (US); Qiwei Liang, Fremont, CA (US); Dmitry Lubomirsky, Cupertino, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 182 days.

(21) Appl. No.: 11/670,728

(22) Filed: Feb. 2, 2007

(65) Prior Publication Data

US 2008/0188087 A1      Aug. 7, 2008

(51) Int. Cl.
*H01L 21/00* (2006.01)
(52) U.S. Cl. ............... 438/5; 438/788; 257/E21.528; 257/E21.478; 427/9; 427/255.23
(58) Field of Classification Search ............... 438/676, 438/788, 792, 5, 7, 10, 905; 118/723 R, 118/665; 427/9, 10, 255.23, 255.28
See application file for complete search history.

(56) References Cited

U.S. PATENT DOCUMENTS

| 6,129,829 | A | 10/2000 | Thompson |
| 6,164,295 | A * | 12/2000 | Ui et al. ............... 134/1.1 |
| 6,192,829 | B1 | 2/2001 | Karazim et al. |

(Continued)

OTHER PUBLICATIONS

IN: Siqing Lu et al.; U.S. Appl. No. 11/202,043; filed Feb. 15, 2007; Title: Two-Piece Dome with Separate RF Coils for Inductively Coupled Plasma Reactors; to be published Feb. 2007.
U.S. Appl. No. 11/670,662, filed Feb. 2, 2007, First Named Inventor: Robert Chen.
U.S. Appl. No. 11/670,701, filed Feb. 2, 2007, First Named Inventor: Robert Chen.

*Primary Examiner*—Caridad M Everhart
(74) *Attorney, Agent, or Firm*—Townsend and Townsend and Crew LLP

(57) ABSTRACT

A coil is provided for use in a semiconductor processing system to generate a plasma with a magnetic field in a chamber. The coil comprises a first coil segment, a second coil segment and an internal balance capacitor. The first coils segment has a first end and a second end. The first end of the coil segment is adapted to connect to a power source. The second coil segment has a first and second end. The second end of the first coil segment is adapted to connect to an external balance capacitor. The internal balance capacitor is connected in series between the second end of the first coil segment and the first end of the second coil segment. The internal balance capacitor and the coil segments are adapted to provide a voltage peak along the first coil segment substantially aligned with a virtual ground along the second coil segment.

7 Claims, 17 Drawing Sheets

U.S. PATENT DOCUMENTS

| | | |
|---|---|---|
| 6,353,206 B1 | 3/2002 | Roderick |
| 6,441,555 B1 | 8/2002 | Howald |
| 6,646,385 B2 | 11/2003 | Howald et al. |
| 6,822,185 B2 | 11/2004 | Welch et al. |
| 2003/0042131 A1* | 3/2003 | Johnson ................ 204/192.12 |
| 2004/0083972 A1* | 5/2004 | Li et al. .................... 118/723 I |
| 2006/0075967 A1 | 4/2006 | Lu et al. |
| 2006/0174834 A1 | 8/2006 | Long et al. |

* cited by examiner

INTERNAL BALANCED COIL FOR INDUCTIVELY COUPLED HIGH DENSITY PLASMA PROCESSING CHAMBER

BACKGROUND OF THE INVENTION

The present invention relates generally to the field of semiconductor processing equipment. More particularly, the present invention relates to methods and apparatus for generating plasma, for example coils, used with high density plasma deposition chambers. The methods and apparatus can be applied to other semiconductor processes, for example etch processes used to form integrated circuits.

One of the primary steps in the fabrication of modern semiconductor devices is the formation of a film, such as a silicon oxide film, on a semiconductor substrate. Silicon oxide is widely used as an electrically insulating dielectric layer in the manufacture of semiconductor devices. As is well known, a silicon oxide film can be deposited by a thermal chemical-vapor deposition ("CVD") process or by a plasma-enhanced chemical-vapor deposition ("PECVD") process. In a conventional thermal CVD process, reactive gases are supplied to a surface of the substrate, where heat-induced chemical reactions take place to produce a desired film. In a conventional plasma-deposition process, a controlled plasma is formed to decompose and/or energize reactive species to produce the desired film.

Semiconductor device geometries have decreased significantly in size since such devices were first introduced several decades ago, and continue to be reduced in size. This continuing reduction in the scale of device geometry has resulted in a dramatic increase in the density of circuit elements and interconnections formed in integrated circuits fabricated on a semiconductor substrate. One persistent challenge faced by semiconductor manufacturers in the design and fabrication of such densely packed integrated circuits is the desire to prevent spurious interactions between circuit elements, a goal that has required ongoing innovation as geometry scales continue to decrease.

Unwanted interactions are typically prevented by providing spaces between adjacent elements that are filled with a dielectric material to isolate the elements both physically and electrically. Such spaces are sometimes referred to herein as "gaps" or "trenches," and the processes for filling such spaces are commonly referred to in the art as "gapfill" processes. The ability of a given process to produce a film that completely fills such gaps is thus often referred to as the "gapfill ability" of the process, with the film described as a "gapfill layer" or "gapfill film." As circuit densities increase with smaller feature sizes, the widths of these gaps decrease, resulting in an increase in their aspect ratio, which is defined by the ratio of the gap's height to its depth. High-aspect-ratio gaps are difficult to fill completely using conventional CVD techniques, which tend to have relatively poor gapfill abilities. One family of dielectric films that is commonly used to fill gaps in intermetal dielectric ("IMD") applications, premetal dielectric ("PMD") applications, and shallow-trench-isolation ("STI") applications, among others, is silicon oxide (sometimes also referred to as "silica glass" or "silicate glass").

Some integrated circuit manufacturers have turned to the use of high-density plasma CVD ("HDP-CVD") systems in depositing silicon oxide gapfill layers. Such systems form a plasma that has a density greater than about $10^{11}$ ions/cm$^3$, which is about two orders of magnitude greater than the plasma density provided by a standard capacitively coupled plasma CVD system. Inductively coupled plasma ("ICP") systems are examples of HDP-CVD systems. One factor that allows films deposited by such HDP-CVD techniques to have improved gapfill characteristics is the occurrence of sputtering simultaneous with deposition of material. Sputtering is a mechanical process by which material is ejected by impact, and is promoted by the high ionic density of the plasma in HDP-CVD processes. The sputtering component of HDP deposition thus slows deposition on certain features, such as the corners of raised surfaces, thereby contributing to the increased gapfill ability.

Even with the use of HDP and ICP processes, there remain a number of persistent challenges in achieving desired deposition properties. These include the need to manage thermal characteristics of the plasma within a processing chamber, particularly with high-energy processes that may result in temperatures that damage structures in the chamber. In addition, there is a general desire to provide deposition processes that are uniform across a wafer. Non-uniformities lead to inconsistencies in device performance and may result from a number of different factors. The deposition characteristics at different points over a wafer result from a complex interplay of a number of different effects. For example, the way in which gas is introduced into the chamber, the level of power used to ionize precursor species, the use of electrical fields to direct ions, and the like, may ultimately affect the uniformity of deposition characteristics across a wafer. In addition, the way in which these effects are manifested may depend on the physical shape and size of the chamber, such as by providing different diffusive effects that affect the distribution of ions in the chamber.

One particular challenge with HDP and ICP processes is the management of electric fields and voltages that arise from the use of radiofrequency (RF) coils that are used to generate plasma. The peak to peak voltage used to drive these coils can exceed one kilovolt (kV), and the associated effects of the prolonged use of this high voltage include chamber dome blackening, and particle and metal contamination of integrated circuits. Techniques used to reduce voltage and/or mitigate the effects of high voltage include external balanced capacitor banks, Faraday shielding and high voltage padding of the chamber dome surfaces. Although these mitigation techniques have provided at least some success to mitigate the effects of high voltages, improved techniques are sought.

In addition to the shortcomings described above, work in relation to the present invention also suggests that high voltages contribute, at least in part, to contamination of layers formed with HDP/CVD processes. The high voltages may cause the degradation of protective coatings, for example season coatings, applied to the inner surface of structures inside the chamber, such as a gas baffle, to prevent contamination. This degradation of the protective coating can cause contamination from the structures inside the chamber, for example metal contamination. Such contamination can effect the physical properties of the formed layers, for example the dielectric properties, of layers formed with HDP/CVD processes. As circuits continue to shrink, there is a need to provide layers with improved dielectric properties.

There is accordingly a general need in the art for improved systems for generating plasma that improve deposition across wafers in HDP and ICP processes.

BRIEF SUMMARY OF THE INVENTION

The present invention relates generally to the field of semiconductor processing equipment. More particularly, the present invention relates to methods, apparatus and devices for generating plasma, for example coils, used with high density plasma deposition chambers. The methods and apparatus can be applied to other semiconductor processes, for example etch processes used to form integrated circuits.

In many embodiments a coil for use in a semiconductor processing system to generate a plasma with a magnetic field in a chamber is provided. The coil comprises a first coil segment, a second coil segment and an internal balance capacitor. The first coils segment has a first end and a second end. The first end of the coil segment is adapted to connect to a power source. The second coil segment has a first end and a second end. The second end of the first coil segment is adapted to connect to an external balance capacitor. The internal balance capacitor is connected in series between the second end of the first coil segment and the first end of the second coil segment. The internal balance capacitor and the coil segments are adapted to provide a voltage peak along the first coil segment substantially aligned with a virtual ground along the second coil segment.

In specific embodiments, the internal balance capacitor and the coil segments can be adapted to provide uniform heating. The coil segments can have substantially similar lengths and/or inductances. The coil segments and internal balance capacitor can be provided as components of a kit.

In many embodiments a method is provided for generating plasma with a coil in a semiconductor process. An electrical current is passed through a first segment of the coil to generate a first voltage peak disposed near an end of the first coil segment and a virtual ground disposed near the center of the first coil segment. The electrical current is passed through a second segment of the coil to generate a second voltage peak disposed near an end of the second coil segment and a virtual ground disposed near the center of the second coil segment. The voltage peak near the end of the first coil segment is aligned with the virtual ground of the second coil segment.

In many embodiments, a substrate processing device is provided. The device includes a coil with at least one internal balance capacitor and a gas distributor. The coil comprises a first coil segment and a second coil segment. The first and second coil segments arranged to generate a plasma with a magnetic field. The coil comprises at least about two turns. At least one internal balance capacitor is connected in series between the first coil segment and the second coil segment. A gas distributor is disposed near the coil. An electric field extends from the coil through the gas distributor toward a grounded structure connected to the gas distributor. The at least one capacitor and segments of the coil are arranged to decrease a voltage of the electric field that extends from the first coil through the gas distributor.

In specific embodiments, the device may comprise a second coil which includes a first coil segment and a second coil segment. The first and second coil segments of the second coil can be arranged so as to generate a plasma with a second magnetic field. At least one internal balance capacitor can be connected in series between the first coil segment and the second coil segment of the second coil. The first coil and the second coil are arranged so as to at least partially overlap the magnetic fields from the coils to generate the plasma. In specific embodiments, the coils may be adapted to provide a high power HDP/CVD process with a voltage below a chamber blackening threshold.

In many embodiments, a method of depositing a layer on a substrate is provided. A deposition gas is released from a gas distributor into a semiconductor process chamber. A plasma is generated with an induction coil that applies a magnetic field to the semiconductor process chamber. A capacitor located between segments of the coil is charged to decrease a voltage applied to the coil. An electric field is generated with the voltage to the coil, and the electric field extends from at least one of the coil segments through the gas distributor and toward a grounded structure. The layer is deposited on the semiconductor substrate with the plasma.

In many embodiments, a method of depositing a layer with an HDP/CVD semiconductor processing chamber is provided. A value of at least one HDP/CVD deposition parameter is determined. An etch rate of a protective chamber coating disposed on a surface of structure inside the chamber is determined based on the value of the HDP/CVD deposition parameter. A value of a chamber season parameter to form the protective chamber coating on the surface of the structure is determined in response to the etch rate. The chamber is seasoned to form the protective coating on the surface of the structure based on the value of the chamber season parameter. A semiconductor wafer is inserted into the chamber. The HDP/CVD process is applied to deposit the layer on the wafer based on the value of the HDP/CVD deposition parameter. The HDP/CVD process is stopped before the protective coating is removed and a portion of the surface of the structure is exposed. The wafer is removed from the chamber.

In many embodiments, an apparatus is provided for depositing a layer on a semiconductor wafer. The apparatus comprises a semiconductor process chamber, a coil to generate a plasma within the chamber, and a gas supply to deliver gas to the chamber. A processor controls a power level to the coil, the gas supply to the chamber, and a deposition of the layer on the wafer. The processor is adapted to determine an etch rate of a protective chamber coating disposed on a surface of a structure inside the chamber based on an HDP/CVD deposition parameter.

A further understanding of the nature and advantages of the present invention may be realized by reference to the remaining portions of the specification and the drawings.

DETAILED DESCRIPTION OF THE INVENTION

The present invention relates generally to the field of semiconductor processing equipment. More particularly, the present invention relates to methods and apparatus for generating plasma, for example coils, used with high density plasma deposition chambers. The methods and apparatus can be applied to other semiconductor processes, for example etch processes used to form integrated circuits.

1. Exemplary ICP Chamber

Figure 1:
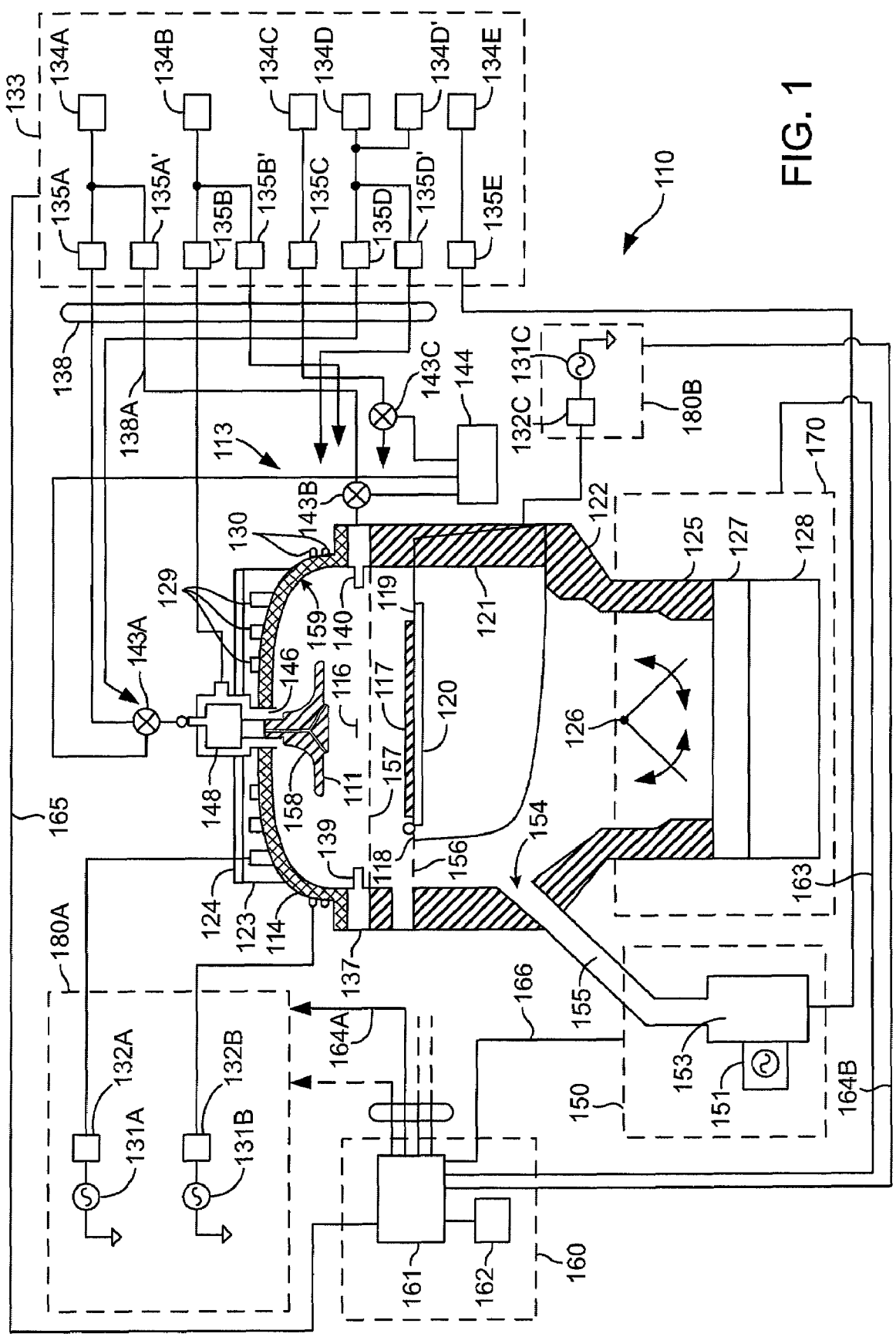
FIG. 1 is a simplified cross-sectional view of an exemplary ICP reactor system.

Embodiments of the present invention use systems manufactured by APPLIED MATERIALS, INC., of Santa Clara, Calif., a general description of which is provided in commonly assigned U.S. Pat. Nos. 5,994,662; 6,170,428; and 6,450,117; and U.S. patent application Ser. Nos. 10/963,030 and 11/075,527; the entire disclosures of these patents and applications are incorporated herein by reference. An overview of the ICP reactor is provided in connection with FIG. 1. FIG. 1 schematically illustrates the structure of an exemplary HDP-CVD system 110 in one embodiment. The system 110 includes a chamber 113, a vacuum system 170, a source plasma system 180A, a bias plasma system 180B, a gas delivery system 133, and a remote plasma cleaning system 150.

Embodiments of the present invention can be used with low, medium and high power HDP/CVD processes. The low, medium and high power processes can be used with HDP/CVD chambers having a cross sectional diameter and/or dimensions adapted to process 200, 300 and 450 mm wafers. For 300 mm wafers, high power processes typically include power above about 15 kW, for example from 15 kW to 18 kW. Medium power processes typically include power with a range from about 8 to 12 kW. Low power processes are generally under about 8 kW. For larger wafers, for example 450 mm wafers, the power levels corresponding to low, medium and high power processes can increase accordingly. For smaller wafers, for example 200 mm wafers, the power levels corresponding to low, medium and high power process can decrease accordingly. As is explained below, the coils described herein below can be used to provide high power processes with voltages applied to coils that are below the threshold voltage for chamber blackening.

The upper portion of chamber 113 includes a dome 114, which is made of a ceramic dielectric material, such as aluminum oxide or aluminum nitride, sapphire, SiC or quartz. A heater plate 123 and a cold plate 124 surmount, and are thermally coupled to, dome 114. Heater plate 123 and cold plate 124 allow control of the dome temperature to within about ±10° C. over a range of about 100° C. to 200° C. Dome 114 defines an upper boundary of a plasma processing region 116. Plasma processing region 116 is bounded on the bottom by the upper surface of a substrate 117 and a substrate support member 118.

The lower portion of chamber 113 includes a body member 122, which joins the chamber to the vacuum system. A base portion 121 of substrate support member 118 is mounted on, and forms a continuous inner surface with, body member 122. Substrates are transferred into and out of chamber 113 by a robot blade (not shown) through an insertion/removal opening (not shown) in the side of chamber 113. Lift pins (not shown) are raised and then lowered under the control of a motor (also not shown) to move the substrate from the robot blade at an upper loading position 157 to a lower processing position 156 in which the substrate is placed on a substrate receiving portion 119 of substrate support member 118. Substrate receiving portion 119 includes an electrostatic chuck 120 that secures the substrate to substrate support member 118 during substrate processing. In a preferred embodiment, substrate support member 118 is made from an aluminum oxide or aluminum ceramic material.

Vacuum system 170 includes throttle body 125, which houses twin-blade throttle valve 126 and is attached to gate valve 127 and turbo-molecular pump 128. It should be noted that throttle body 125 offers minimum obstruction to gas flow, and allows symmetric pumping. Gate valve 127 can isolate turbo-molecular pump 128 from throttle body 125, and can also control chamber pressure by restricting the exhaust flow capacity when throttle valve 126 is fully open. The arrangement of the throttle valve, gate valve, and turbo-molecular pump allow accurate and stable control of chamber pressures from between about 1 millitorr to about 2 torr.

The source plasma system 180A includes a top coil 129 and side coil 130, mounted on dome 114. A symmetrical ground shield (not shown) reduces electrical coupling between the coils. Top coil 129 is powered by top source RF generator 131A, whereas side coil 130 is powered by side source RF generator 131B, allowing independent power levels and frequencies of operation for each coil. This dual coil system allows control of the radial ion density in chamber 113, thereby improving plasma uniformity. Side coil 130 and top coil 129 are typically inductively driven, which does not require a complimentary electrode. In a specific embodiment, the top source RF generator 131A provides up to 2,500 watts of RF power at nominally 2 MHz and the side source RF generator 131B provides up to 5,000 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency. In many embodiments, the top and side coils can be cooled by a liquid.

A bias plasma system 180B includes a bias RF ("BRF") generator 131C and a bias matching network 132C. The bias plasma system 180B capacitively couples portion 117 to body member 122, which act as complimentary electrodes. The bias plasma system 180B serves to enhance the transport of plasma species (e.g., ions) created by the source plasma system 180A to the surface of the substrate. In a specific embodiment, bias RF generator provides up to 5,000 watts of RF power at 13.56 MHz.

RF generators 131A and 131B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 132A and 132B match the output impedance of generators 131A and 131B with top coil 129 and side coil 130, respectively. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

A gas delivery system 133 provides gases from several sources chamber for processing the substrate via gas delivery lines 138 (only some of which are shown). As would be understood by a person of skill in the art, the actual sources used and the actual connection of gas delivery lines 138 to chamber 113 varies depending on the deposition and cleaning processes executed within chamber 113. Gases are introduced into chamber 113 through a gas ring 137 and/or a gas distributor 111.

In one embodiment, first gas source 134A, second gas source 134B, multifunction gas flow controller 135A' and multifunction gas flow controller 135B', provide gas to ring plenum in gas ring 137 via gas delivery lines 138 (only some of which are shown). Gas ring 137 has a plurality of source gas nozzles 139 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 137 has 12 source gas nozzles made from an aluminum oxide ceramic.

Gas ring 137 also has a plurality of oxidizer gas nozzles 140 (only one of which is shown), which in a preferred embodiment are co-planar with and shorter than source gas nozzles 139, and in one embodiment receive gas from body plenum. In some embodiments it is desirable not to mix source gases and oxidizer gases before injecting the gases into chamber 113. In other embodiments, oxidizer gas and source gas may be mixed prior to injecting the gases into chamber 113 by providing apertures (not shown) between body plenum and gas ring plenum. In one embodiment, third gas source 134C, fourth gas source 134D, fifth gas source 134D', gas flow controller 135C and multifunction gas flow controller 135D, provide gas to body plenum via gas delivery lines 138. Additional valves, such as valve 143B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 143B, to isolate chamber 113 from delivery line 138A and to vent delivery line 138A to vacuum foreline 144, for example. As shown in FIG. 1, other similar valves, such as valve 143A and valve 143C, may be incorporated on other gas delivery lines. For example, multifunction gas flow controller 135D can be connected to valve 143A to provide gases gas from fourth gas source 134D and fifth gas source 134D' to the chamber.

Chamber 113 also has a gas distributor 111 (or top nozzle) and top vent 146. Gas distributor 111 and top vent 146 allow independent control of top and side flows of the gases, which improves film uniformity and allows fine adjustment of the film's deposition and doping parameters. Top vent 146 is an annular opening around gas distributor 111. Gas distributor 111 includes a plurality of apertures in a step according to an embodiment of the present invention for improved gas distribution. In one embodiment, first gas source 134A supplies source gas nozzles 139 and gas distributor 111. Source nozzle multifunction gas flow controller 135A' controls the amount of gas delivered to source gas nozzles 139 and top nozzle multifunction gas flow controller 135A controls the amount of gas delivered to gas distributor 111. Similarly, multifunction gas flow controller 135B and multifunction gas flow controller 135B' may be used to control the flow of oxygen to both top vent 146 and oxidizer gas nozzles 140 from a single source of oxygen, such as second gas source 134B. The gases supplied to gas distributor 111 and top vent 146 may be kept separate prior to flowing the gases into chamber 113, or the gases may be mixed in top plenum 148 before they flow into chamber 113. Separate sources of the same gas may be used to supply various portions of the chamber.

Gas distributor 111 comprises a gas baffle 158. Gas baffle 158 is formed on gas distributor 111 to direct flows of clean gas toward the chamber wall and can also be used to direct flows of remotely generated plasma and clean gas. The gas distributor includes separate channels that pass separate gases into chamber 113 where the gases mix and react above the semiconductor substrate.

To prevent contamination during deposition of a dielectric layer on a wafer, chamber 113 can seasoned with a protective coating 159 that also covers gas distributor 111. The protective coating, for example SiO2, can cover structures inside the chamber so that material from the structures inside the chamber is not released into the chamber so as to cause contamination of the dielectric layer during the deposition process. In many embodiments, the chamber can be seasoned with the protective coating before the dielectric layer is deposited on the wafer.

A remote microwave generated plasma cleaning system 150 is provided to periodically clean deposition residues from chamber components. The cleaning system includes a remote microwave generator 151 that creates a plasma from a cleaning gas source 134E (e.g., molecular fluorine, nitrogen trifluoride, other fluorocarbons or equivalents) in reactor cavity 153. In many embodiments a gas flow controller 135E controls the flow of gas from cleaning gas source 134E to reactor cavity 153. The reactive species resulting from this plasma are conveyed to chamber 113 through cleaning gas feed port 154 via applicator tube 155. The materials used to contain the cleaning plasma (e.g., reactor cavity 153 and applicator tube 155) may be resistant to attack by the plasma. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 120, do not need to be covered with a dummy wafer or otherwise protected, as may be required with an in situ plasma cleaning process.

In FIG. 1, the plasma cleaning system 150 is shown below the chamber 113, although other positions may alternatively be used, for example above chamber 113 as described in U.S. application Ser. No. 10/963,030, the full disclosure of which has been previously incorporated herein by reference. In this alternate embodiment, the distance between the reactor cavity and feed port are kept as short as practical, since the concentration of desirable plasma species may decline with distance from reactor cavity. With a cleaning gas feed positioned at the top of the chamber above the baffle, remotely generated plasma species provided through the cleaning gas feed port can be directed to the sides of the chamber by the baffle.

System controller 160 controls the operation of system 110. In a preferred embodiment, system controller 160 includes a memory 162, which comprises a tangible medium such as a hard disk drive, a floppy disk drive (not shown), and a card rack (not shown) coupled to a processor 161. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 160 operates under the control of a computer program stored on the tangible medium for example the hard disk drive, or through other computer programs, such as programs stored on a removable disk. The computer program dictates, for example, the timing, mixture of gases, RF power levels and other parameters of a particular process. The interface between a user and the system controller is via a monitor, such as a cathode ray tube ("CRT"), and a light pen.

System controller 160 controls the season time of the chamber and gases used to season the chamber, the clean time and gases used to clean the chamber, and the application of plasma with the HDP CVD process. To achieve this control, the system controller 160 is coupled to many of the components of system 110. For example, system controller 160 is coupled to vacuum system 170, source plasma system 180A, bias plasma system 180B, gas delivery system 133, and remote plasma cleaning system 150. System controller 160 is coupled to vacuum system 170 with a line 163. System controller 160 is coupled to source plasma system 180 with a line 164A and to bias plasma system 180B with a line 164B. System controller 160 is coupled to gas delivery system 133 with a line 165. System controller 160 is coupled to remote plasma cleaning system 150 with a line 166. Lines 163, 164A, 164B, 165 and 166 transmit control signals from system controller 160 to vacuum system 170, source plasma system 180A, bias plasma system 180B, gas delivery system 133, and remote plasma cleaning system 150, respectively. For example, system controller 160 separately controls each of the gas flow controllers and multifunction gas flow controllers with a line 165. Line 165 can comprise several separate control lines connected to each flow controller. It will be understood that system controller 160 can include several distributed processors to control the components of system 110. Source plasma system 180A is connected to connected to top coil 129 and side coil 130 so that the top coil voltage and side coil voltage can be controlled by system controller 160.

2. Internal Balance Coil Design

Figure 2B:
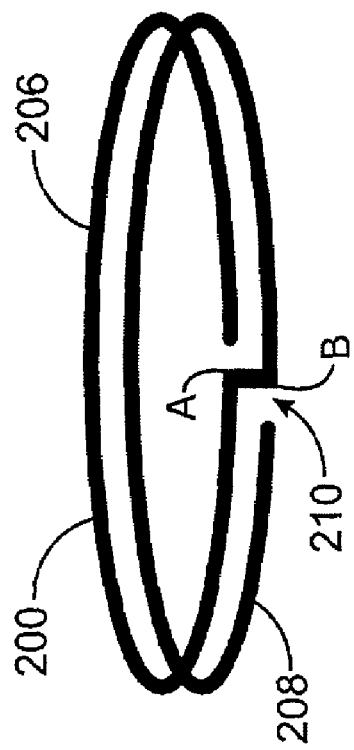
FIG. 2B shows a side coil incorporating an internal balance capacitor according to an embodiment of the present invention.
Figure 2A:
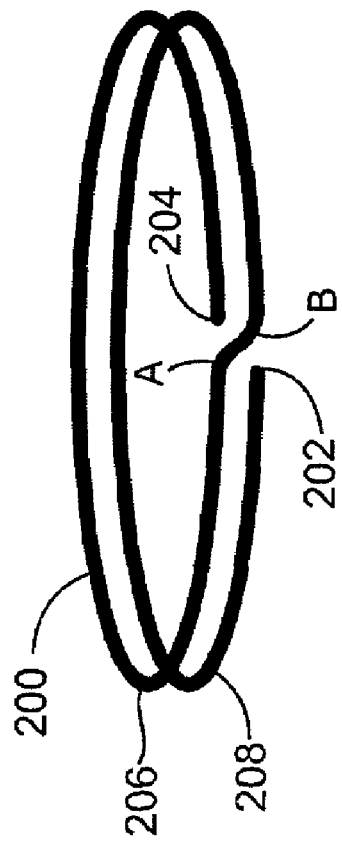
FIG. 2A shows a side coil suitable for incorporating the an internal balance capacitor in accordance with embodiments of the present invention.

FIG. 2A shows a side coil 200 suitable for incorporating an internal balance capacitor in accordance with embodiments of the present invention. Side coil 200 includes a top turn 206 with an end 204 and a bottom turn 208 with an end 202. An attachment point A for an internal balance capacitor is located along top turn 206 opposite end 204. An attachment point B along bottom turn 208 is located opposite end 202. A conductor connects attachment point A with attachment point B.

FIG. 2B shows a side coil incorporating an internal balance capacitor according to an embodiment of the present invention. An internal balance capacitor 210 is shown inserted in series between top turn 206 and bottom turn 208. Internal balance capacitor package 210 is connected to attachment point A and attachment point B and connects the top coil with the bottom coil through the attachment points. The distance along top turn 206 from end 204 to attachment point A is the same as a distance along bottom turn 208 from end 202 to attachment point B. As the diameter of top turn 206 is approximately the same as the diameter of bottom turn 208, the inductances of the top and bottom turns are substantially the same. Top turn 206 and bottom turn 208 each define first and second coil segments, respectively. Thus, each of the first and second coil segments has a substantially similar length, diameter and inductance. In a preferred embodiment, the side coil inductance can be about 4 mH without plasma and about 2 mH when plasma is generated with the HDP/CVD process, and the inductance of each of the two coil segments is about 1 mH when the plasma is generated.

Figure 2C:
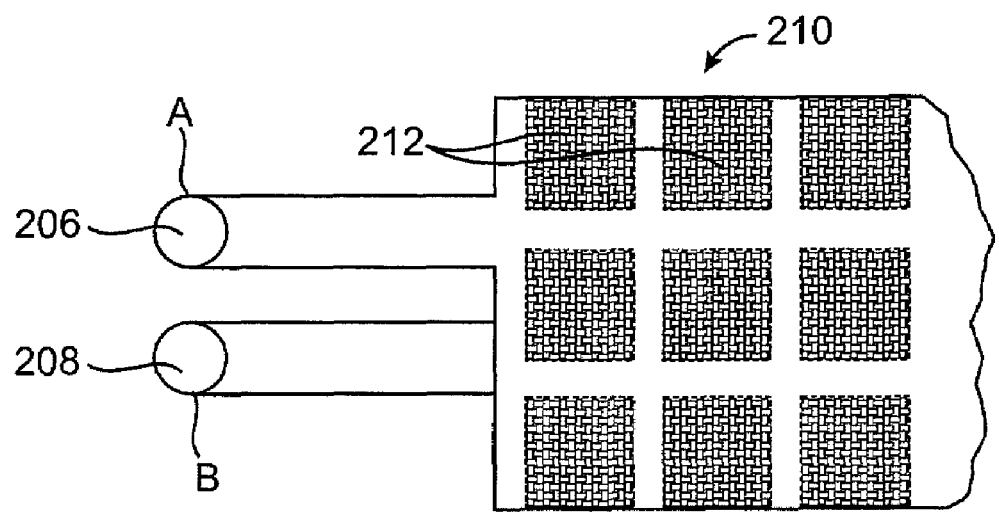
FIG. 2C shows a side view of a ceramic capacitor package, according to an embodiment of the present invention.

FIG. 2C shows a side view of an internal balance capacitor 210, according to an embodiment of the present invention. Internal balance capacitor 210 connects top turn 206 with bottom turn 208 at attachment point A and attachment point B, respectively. Internal balance capacitor 210 comprises several ceramic capacitors 212. Ceramic capacitors 212 are selected for use high voltage and durability.

Figure 2D:
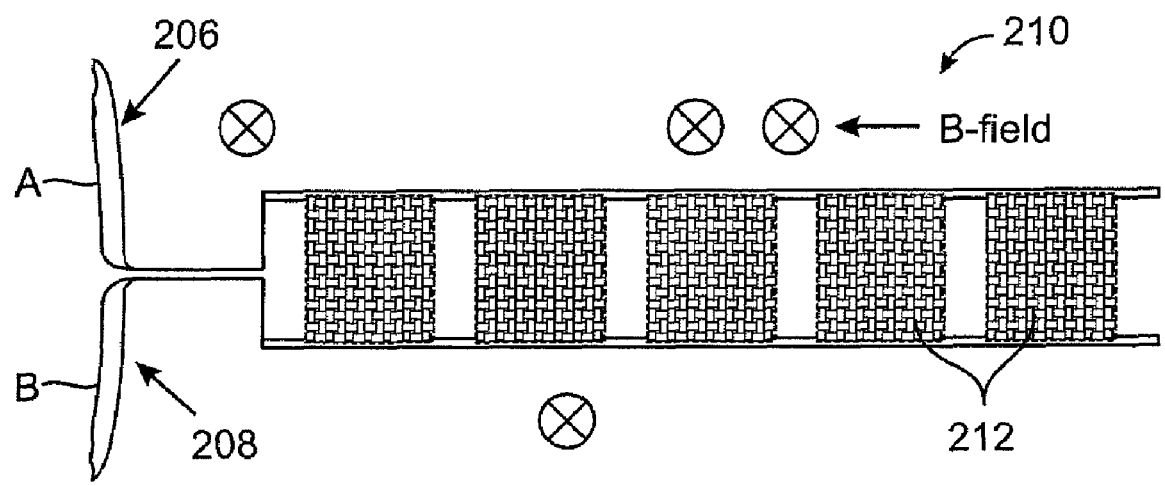
FIG. 2D shows a top view of a ceramic capacitor package as in FIG. 2C, according to an embodiment of the present invention.

FIG. 2D shows a top view of a ceramic capacitor package as in FIG. 2C, according to an embodiment of the present invention. An elongate side of the ceramic capacitor package is aligned substantially parallel to a magnetic field (B-field) to minimize eddy currents.

Figure 2E:
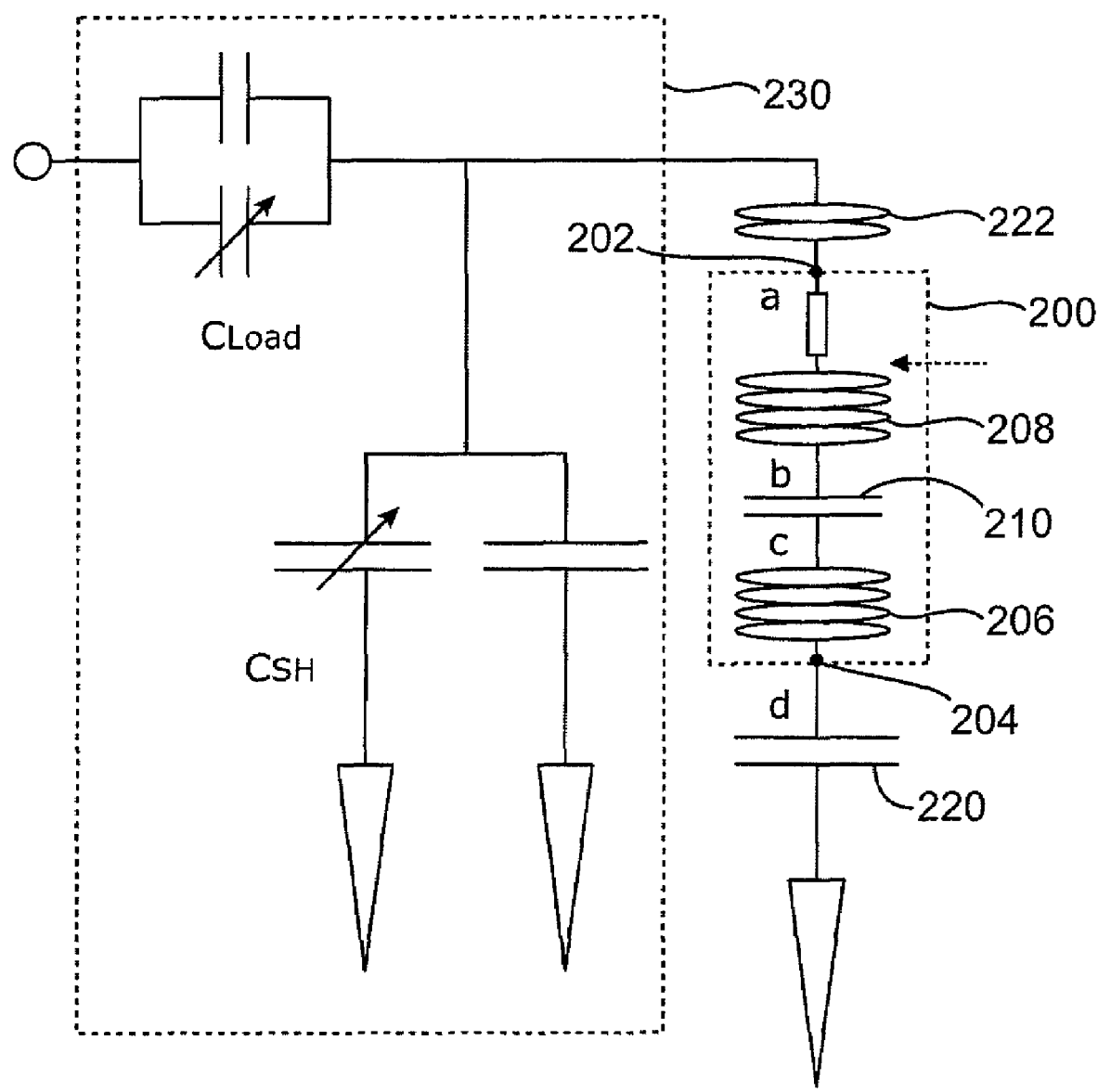
FIG. 2E shows a schematic illustration of an RF circuit with a side coil having an internal balance capacitor, according to an embodiment of the present invention.

FIG. 2E shows a schematic illustration of an RF circuit for the internally balanced side coil, according to an embodiment of the present invention. A local match network 230 is attached to side coil 200. Local match network 230 is connected to side coil 200 at end 202. Local match networks are well known in the field of ICP design, and local match network 230 employs known methods of matching output impedance of the match network with the input impedance of side coil 200. An inductor 222 is shown in series between side coil 200 and local match network 230, although inductor 222 is optional. End 204 of side coil 200 is connected to a balance capacitor 220, and balance capacitor 220 is connected to a ground reference voltage. As balance capacitor 220 is outside side coil 200, balance capacitor 220 can also be referred to as an external balance capacitor. Balance capacitor 220 comprises a bank of capacitors.

Top turn 206, bottom turn 208 and internal balance capacitor 210 have physical properties selected to permit plasma induction with a lower voltage. The inductances of the top turn coil segment and the bottom turn coil segment will depend on the shape and dimensions of the coil segments and the nature of the plasma generated. The inductance of the coil segments and can be measured and/or calculated, for example from the impedance measured and derived from Z-scan data at known frequencies. In a preferred embodiment, the side coil impedance (Z) is 0.7+j 25.2Ω at a frequency of about 2.1 MHz. The capacitor values are selected based on the inductance of the coil segments. In a preferred embodiment, balance capacitor 220 has a capacitance of about 6600 pF, and balance capacitor 220 has a capacitance of about 12,400 pF.

Internal balance capacitor 210 and balance capacitor 220 provide a decrease in the voltage used to drive side coil 200 to induce plasma in the reactor chamber. Balance capacitor 220 provides a virtual ground inside side coil 200 so that the peak to peak voltage on ends 202 and 204 is decreased. In addition, internal balance capacitor 210 provides additional reduction in voltage used to induce plasma in the reactor chamber. In general, the decrease in voltage is related to 1/(N+1) where N is the number of internal balance capacitors. Thus, for a single internal balance capacitor, as shown in FIGS. 2B to 2E, the voltage is decreased by a factor of 0.5 so that the applied voltage is halved. Additional internal balance capacitors can be employed to further decrease the voltage used to drive the coil.

Figure 3A:
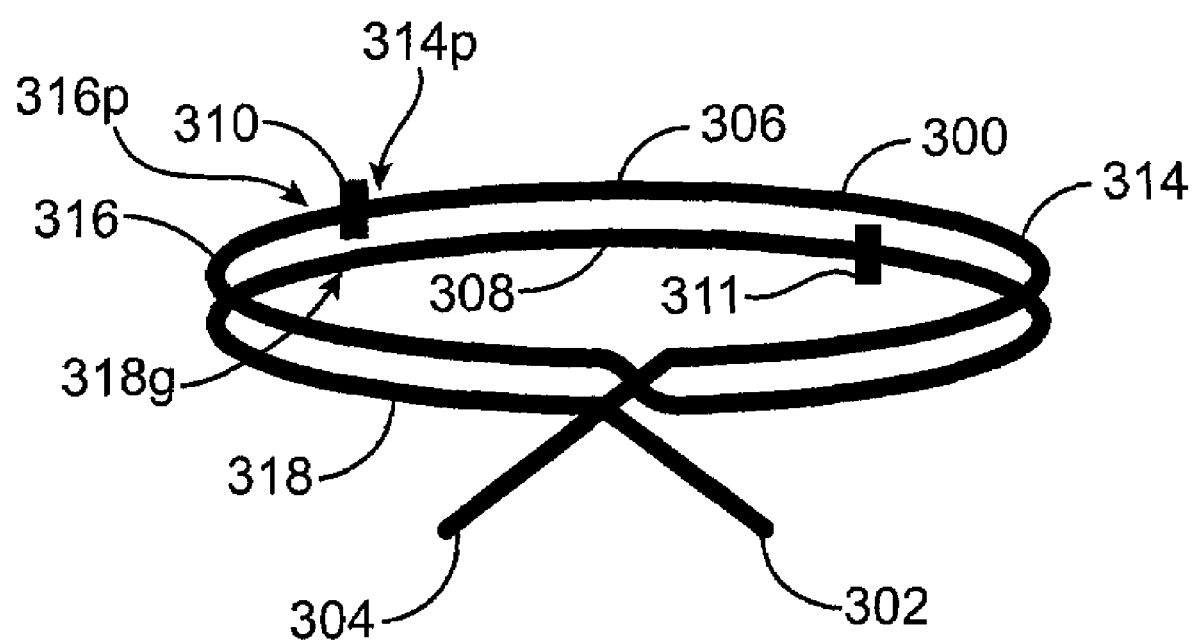
FIG. 3A shows a side coil comprising two internal balance capacitors according to an embodiment of the present invention.

FIG. 3A shows a side coil 300 comprising two internal balance capacitors according to an embodiment of the present invention. Side coil 300 includes an end 302 attached to a bottom turn 308 of side coil 300, and an end 304 attached to a top turn 306 of side coil 300. An internal balance capacitor 310 is inserted in series in top turn 306, and an internal balance capacitor 311 is inserted in series in bottom turn 308 of side coil 300. A first coil segment 314 includes two thirds of top turn 306 and extends from internal balance capacitor 310 toward end 304. A second coil segment 316 includes one third of top turn 306 and one third of bottom coil 308 and extends between internal balance capacitor 310 and internal balance capacitor 311. A third coil segment 318 includes two thirds of bottom turn 308 and extends from internal balance capacitor 311 toward end 302. Each coil segment has a substantially similar inductance and includes a substantially similar fraction of the total number of turns, for example one third of 2 turns. Each internal balance capacitor comprises a package of internal balance capacitors as described above, including the orientation of the internal balance capacitor package with respect to the B field.

Virtual peaks along a first coil segment can be aligned with a virtual ground along another coil segment to heat the plasma and/or the plasma chamber uniformly. The voltage profile of each coil segment can include a voltage peak near each end of each coil segment and a virtual ground near the center of each coil segment. As shown in FIG. 3A, a voltage peak 314P is shown near an end of first coil segment 314 that is connected to and near internal balance capacitor 310, and a voltage peak 316P is shown near an end of second coil segment 316 that is connected to and near internal balance capacitor 310. A virtual ground 318g is shown near the center of third coil segment 318. Voltage peak 314P and voltage peak 316P are each aligned with virtual ground 318g to heat the plasma and/or plasma chamber uniformly. Alignment of the voltage peaks and virtual grounds for a coil comprising three coil segments and two internal balance capacitors is described in FIGS. 5C and 5D herein below.

Figure 3B:
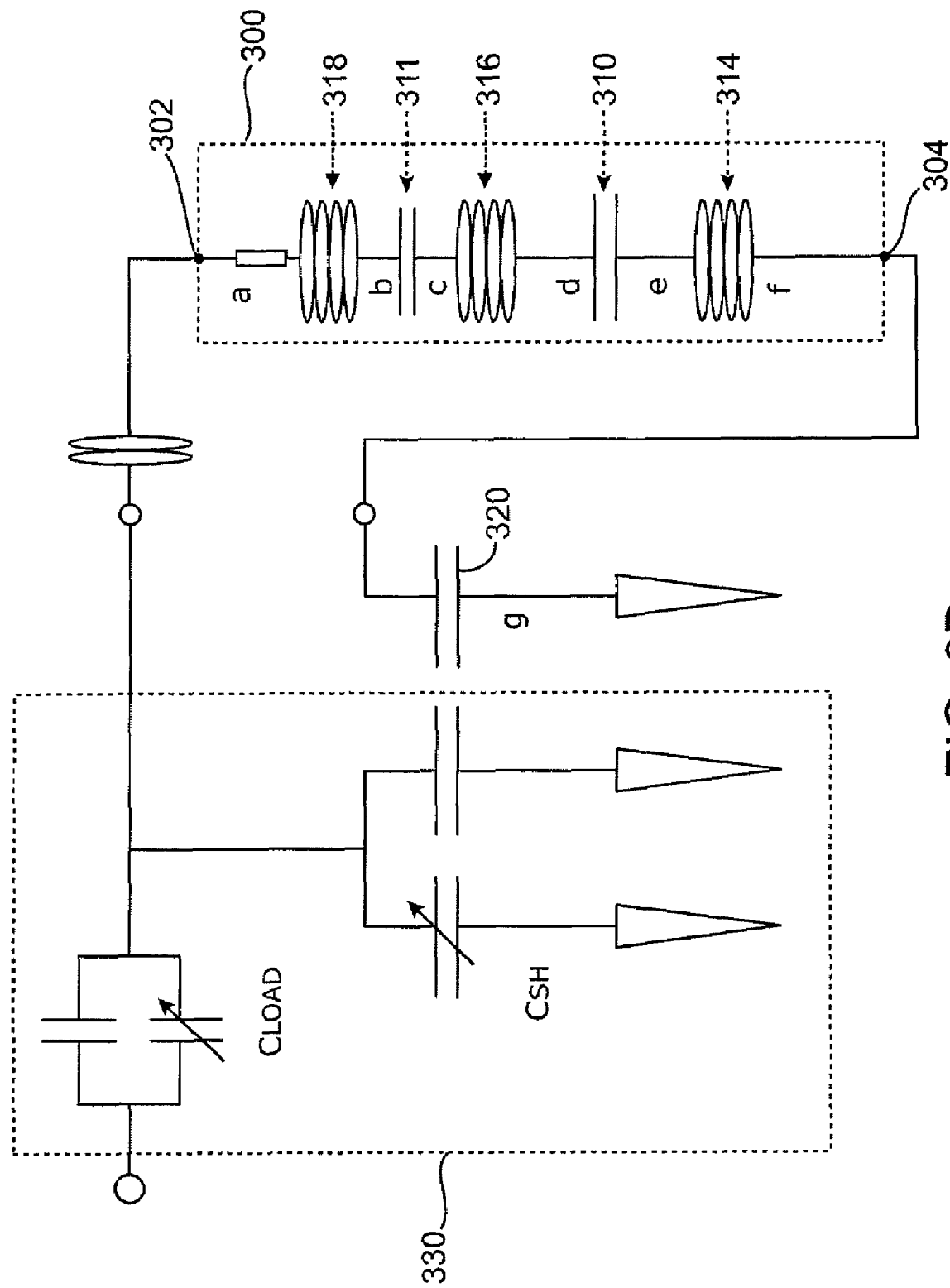
FIG. 3B shows a schematic illustration of an RF circuit comprising two internal balance capacitors according to an embodiment of the present invention.

FIG. 3B shows a schematic illustration of an RF circuit comprising two internal balance capacitors according to an embodiment of the present invention. End 302 of side coil 300 is connected to a local match network 330. Local match networks are well known in the field of ICP design, and local match network 330 employs known methods of matching output impedance of the match network with the input impedance of side coil 300. End 304 of side coil 300 is connected to a balance capacitor 320. Balance capacitor 320 is also connected to a ground reference voltage.

First coil segment 314, capacitor 310, second coil segment 316, capacitor 311 and third coil segment 318 have physical properties selected to permits plasma induction with a lower voltage. The inductance of each coil segment is substantially similar to the inductance of the other coil segments. The inductance of each segment will depend on the shape and dimensions of the coil segment and the nature of the plasma generated. The inductance of the coil segments can be measured and/or calculated, for example from the impedance at known frequencies, as described above. In a preferred embodiment, the impedance of the top coil is 0.55+j 14Ω at approximately 1.9 MHz. The capacitance of each internal balance capacitor is substantially the same as the other capacitor. The capacitor values are selected based on the inductance of the coil segments as described above. In a preferred embodiment, the internal balance capacitors have a capacitance of about 9,500 pF, and balance capacitor 320 has a capacitance of about 18,900 pF.

Internal balance capacitor 310, internal balance capacitor 311 and balance capacitor 320 provide a decrease in the voltage used to drive side coil 300 to induce plasma in the reactor chamber. Balance capacitor 320 provides a virtual ground inside side coil 300 so that the peak to peak voltage on end 302 and end 304 is decreased. In addition, internal balance capacitor 310 and internal balance capacitor 311 provide additional reduction in voltage used to induce plasma in the reactor chamber. As described above, the decrease in voltage is related to 1/(N+1) where N is the number of internal balance capacitors. Thus, for two internal balance capacitors, as shown in FIGS. 3A and 3B, the voltage is decreased by a factor of 0.33 so that the applied voltage is one third. The inductance of each coil segment is about ⅔ mH when the plasma is generated. Additional internal balance capacitors can be employed to further decrease the voltage used to drive the coil.

Figure 4A:
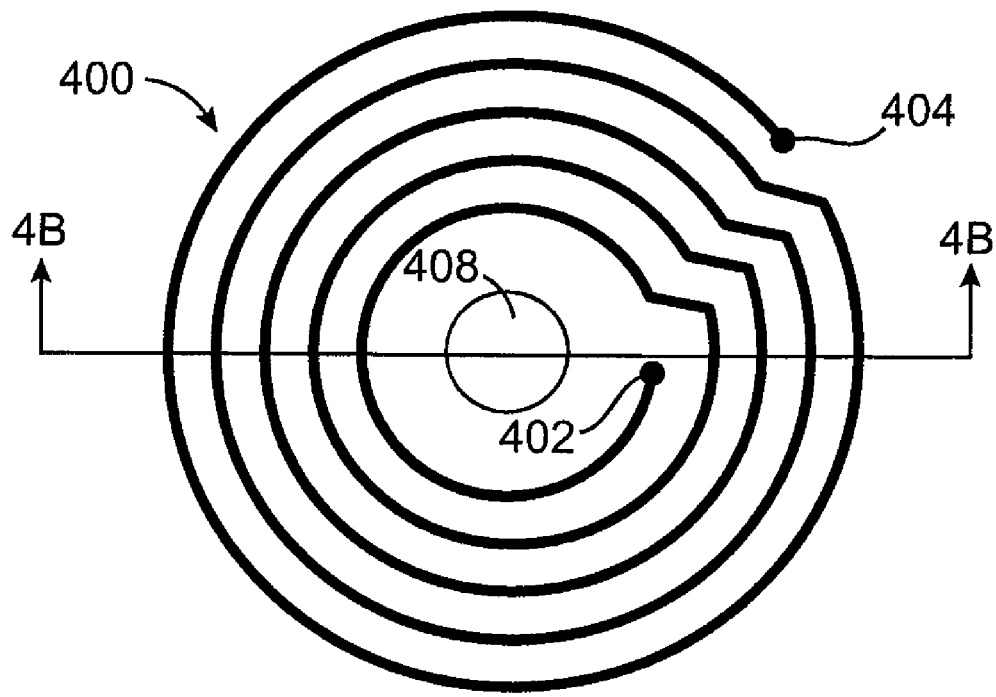
FIG. 4A shows a top view of a top coil suitable for incorporation of an internal balance capacitor, according to an embodiment of the present invention.

FIG. 4A shows a top coil 400 suitable for incorporation of an internal balance capacitor, according to an embodiment of the present invention. Top coil 400 includes five rings connected in series and is approximately spiral. Top coil 400 includes an end 402. End 402 is disposed near a center of top coil 400. Top coil 400 also includes an end 404. End 404 is disposed peripherally on top coil 400 and opposite to end 402.

Figure 4B:
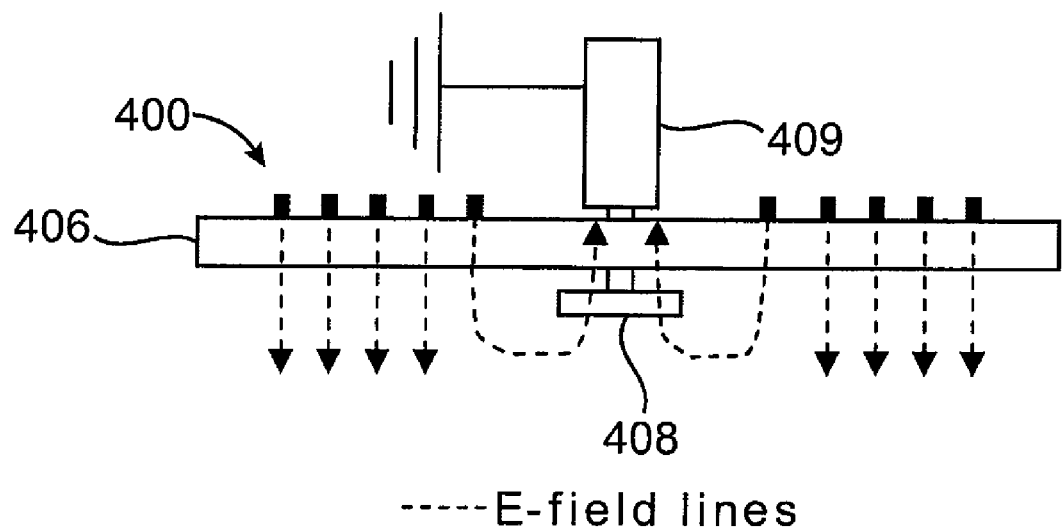
FIG. 4B shows a side view of a top coil as in FIG. 4A suitable for incorporation of an internal balance capacitor, according to an embodiment of the present invention.

FIG. 4B shows a side view of a top coil as in FIG. 4A suitable for incorporation of an internal balance capacitor, according to an embodiment of the present invention. Top coil 400 is positioned on a dome 406 that defines a portion of a plasma chamber, as described above. Top coil 400 provides an E-field that is used to generate the plasma in the chamber. A gas distributor comprising a baffle 408 is disposed in the chamber. A gas supply line 409 is mechanically coupled to baffle 408 to supply gases to the chamber. Gas supply line 409 is grounded.

Work in relation to the present invention suggests that high coil voltages can cause heating and wear of baffle 408 that may contribute impurities to the plasma chamber and decrease the useable life of the baffle. The E-field from top coil 400 passes through baffle 408 to gas supply line 409, which is grounded. The plasma can be directed by the E-field such that the plasma is directed toward the baffle. The voltage potential along the E-filed line may cause the plasma to impact the baffle with ion bombardment, which can cause the baffle to heat, and in some embodiments degrade, during the plasma deposition process. The plasma directed so as to impact baffle 408 may also cause a protective coating, for example an $SiO_2$ season coating, to be removed from baffle 408 so that the baffle degrades and releases debris into the plasma deposition chamber. The degradation of the protective coating can occur non-uniformly over the surface of the gas baffle, such that a portion of the surface of the gas baffle is exposed while other portions of the gas baffle remain coated with the protective coating. Therefore, decreasing voltage applied to top coil 400 can decrease chamber contamination and increase the useful life of baffle 408.

Figure 4C:
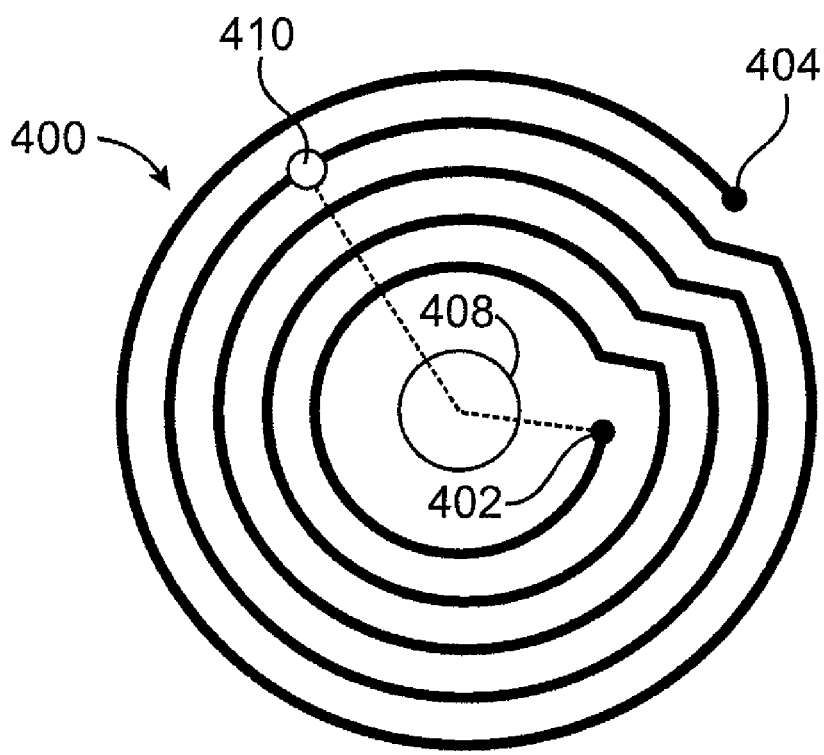
FIG. 4C shows a top coil comprising an internal balance capacitor, according to an embodiment of the present invention.

FIG. 4C shows a top coil comprising an internal balance capacitor, according to an embodiment of the present invention. Top coil 400 includes an internal balance capacitor 410. Internal balance capacitor 410 comprises a package of ceramic capacitors as described above. Internal balance capacitor 410 divides top coil 400 into two coil segments and has a capacitance based on the inductance of the coil segments. The inductance of the coil segments can be calculated and/or measured as described above. In a preferred embodiment, internal balance capacitor 410 is inserted at approximately turn 3.7. The internal balance capacitor is inserted at a location that provides substantially similar inductances for each coil segment. In a preferred embodiment, internal balance capacitor 410 has a capacitance of 5,500 pF and the external balance capacitor has a capacitance of 8,500 pF. Top coil 400 can be connected to an external balance capacitor and a local match network as described above. Internal balance capacitor 410 decrease the voltage applied to the coil by a factor of approximately 0.5. Thus, the voltage applied to top coil 400 to generate plasma is approximately half of the voltage used if internal balance capacitor 410 is not present.

Figure 4D:
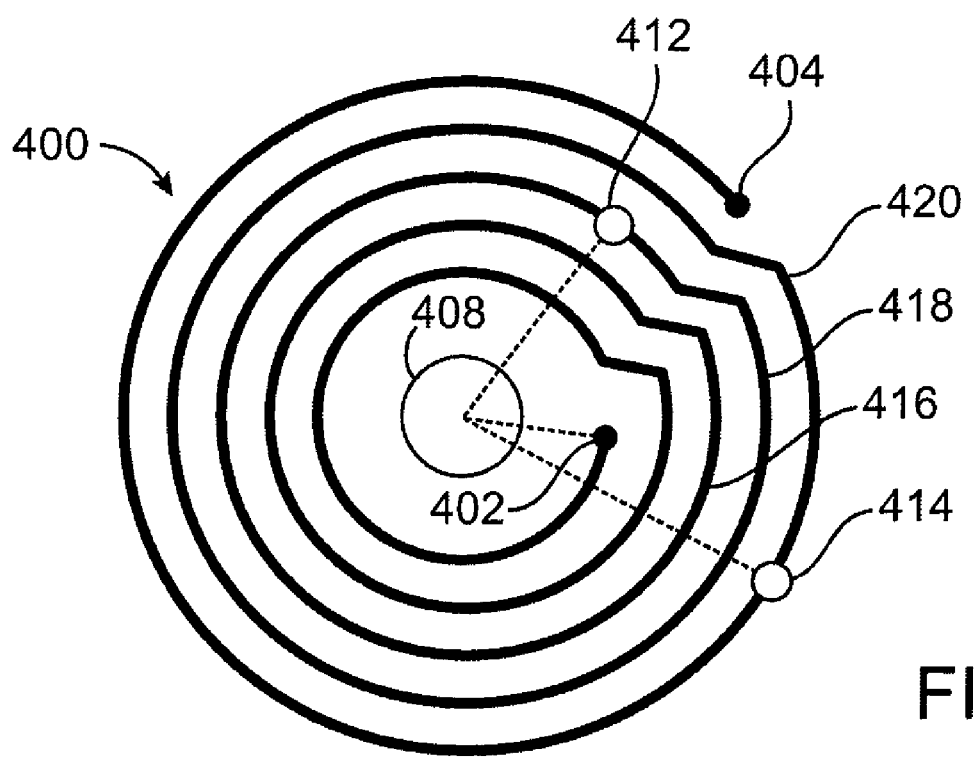
FIG. 4D shows a top coil comprising two internal balance capacitors, according to an embodiment of the present invention.

FIG. 4D shows a top coil comprising two internal balance capacitors, according to an embodiment of the present invention. Top coil 400 includes an internal balance capacitor 412 and an internal balance capacitor 414. The internal balance capacitors comprise packages of ceramic capacitors as described above. Internal balance capacitors 412 and internal capacitor 414 divide top coil 400 into three coil segments. A first coil segment 416 extends from end 402 to internal balance capacitor 412. A second coil segment 418 extends from internal balance capacitor 412 to internal balance capacitor 414. A third coil segment 418 extends from internal balance capacitor 412 to end 404. In a preferred embodiment, internal balance capacitor 412 is inserted in series at approximately turn 2.9, and internal balance capacitor 414 is inserted at approximately turn 4.1.

The locations of the internal balance capacitors are selected to define the lengths of the coil segments so that each coil segment has approximately the same inductance as the other coil segments. Thus, each coil segment has an inductance that is substantially similar to the other coil segments. Each internal balance capacitor has approximately the same inductance as the other internal balance capacitors. The capacitance of the internal balance capacitors is based on the inductance of the three coil segments. The inductance of the coil segments can be calculated and/or measured as described above. In a preferred embodiment, internal balance capacitor 411 and internal balance capacitor 412 each have a capacitance of about 7,700 pF, and the external balance capacitor has a capacitance of about 1500 pF. Top coil 400 can be connected to an external balance capacitor and a local match network as described above. The two internal balance capacitors decrease the voltage applied to the coil by a factor of approximately 0.33. Thus, the voltage applied to top coil 400 to generate plasma is approximately one third of the voltage used if the two internal balance capacitors are not present. Additional internal balance capacitors can be used to further decrease the voltage applied to the top coil to generate the voltage.

3. Simulation Results

FIGS. 5A to 6C show the results of computer simulations of coils used with HDP/CVD plasma deposition process. The simulations used a side coil excitation of frequency of about 2.1 MHz and a top coil excitation frequency of about 1.9 MHz. FIGS. 5A to 5D used an RF power of 4.260 kW for the side coil and FIGS. 6A to 6C used a power of 2.2 kW for the top coil. These simulations used conventional RF circuit analysis techniques and numeric computer simulations.

Figure 5A:
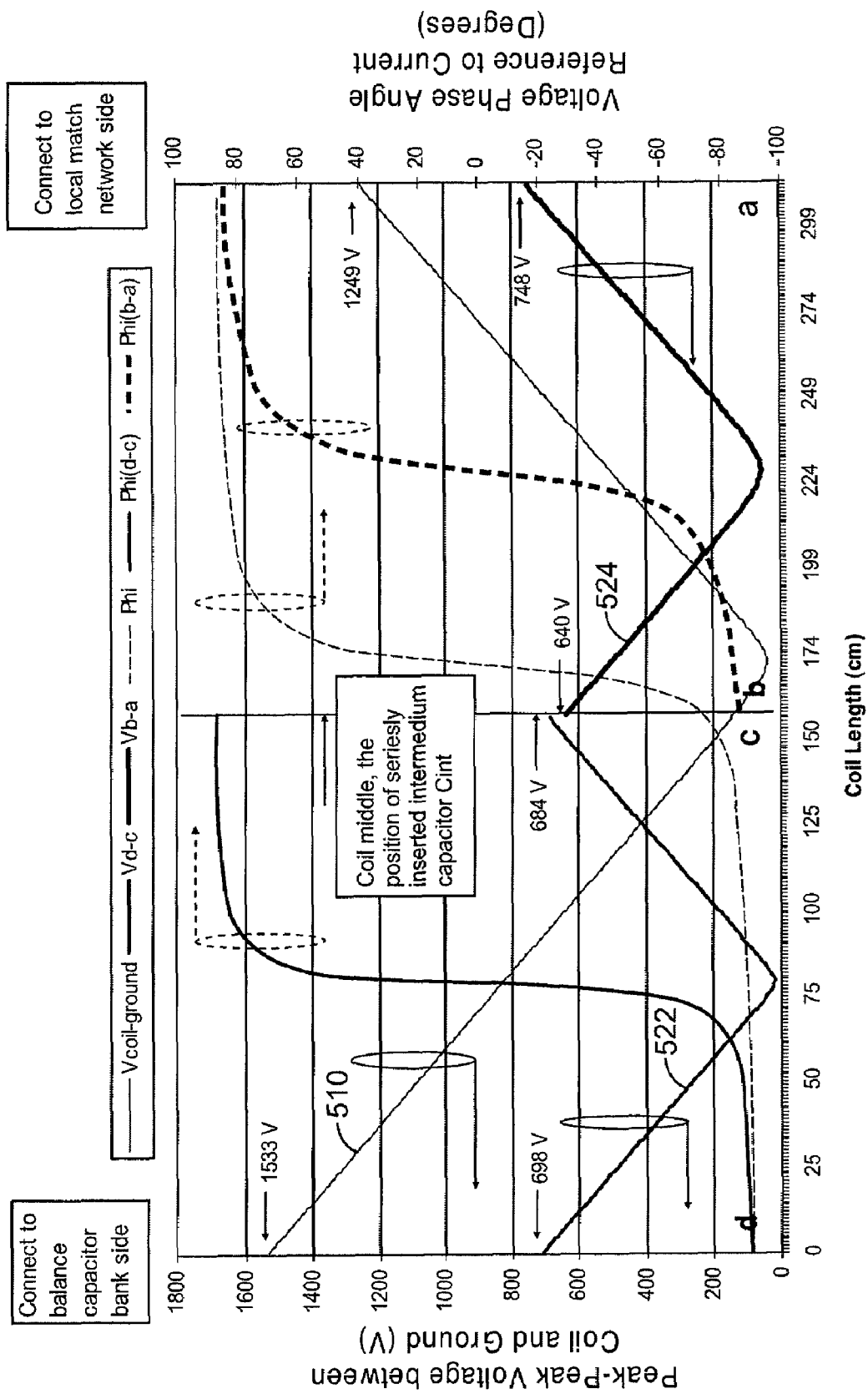
FIG. 5A shows a plot of side coil voltage (coil to ground) and phase angles along the coil length for a side coil with an internal balance capacitor as in FIG. 2B, according to an embodiment of the present invention.

FIG. 5A shows a plot of side coil voltage (coil to ground) and phase angles along the coil length for a side coil with an internal balance capacitor as in FIG. 2B, according to an embodiment of the present invention. A voltage profile 522 is plotted along the bottom turn segment of the side coil as described above. A coil length zero (also noted as "d" in FIG. 2E) corresponds to end 204, and a coil length of approximately 150 cm corresponds to the location of the internal balance capacitor (noted as "c" in FIG. 2E). Voltage profile 522 shows a virtual ground at approximately 75 cm, and voltage peaks at 0 cm and 150 cm of approximately 700 V and 680 V, respectively. A voltage profile 524 is plotted along the top turn segment of the side coil as described above. Voltage profile 524 is plotted along the side coil from about 150 cm to about 300 cm. Voltage profile 524 shows a virtual ground at about 225 cm and peak voltages at 150 and 300 cm of approximately 640 V and 750 V, respectively. For comparison, a voltage profile 510 is plotted for the side coil driven with an external balance capacitor and without the internal balance capacitor. Voltage profile 510 shows a virtual ground near the center of coil at about 170 cm and voltage peaks of approximately 1530 V and 1250 V near end 204 and end 202, respectively. Thus, the simulation shows that the internal balance capacitor used with two coil segments decreases the voltage by about 50%.

Figure 5B:
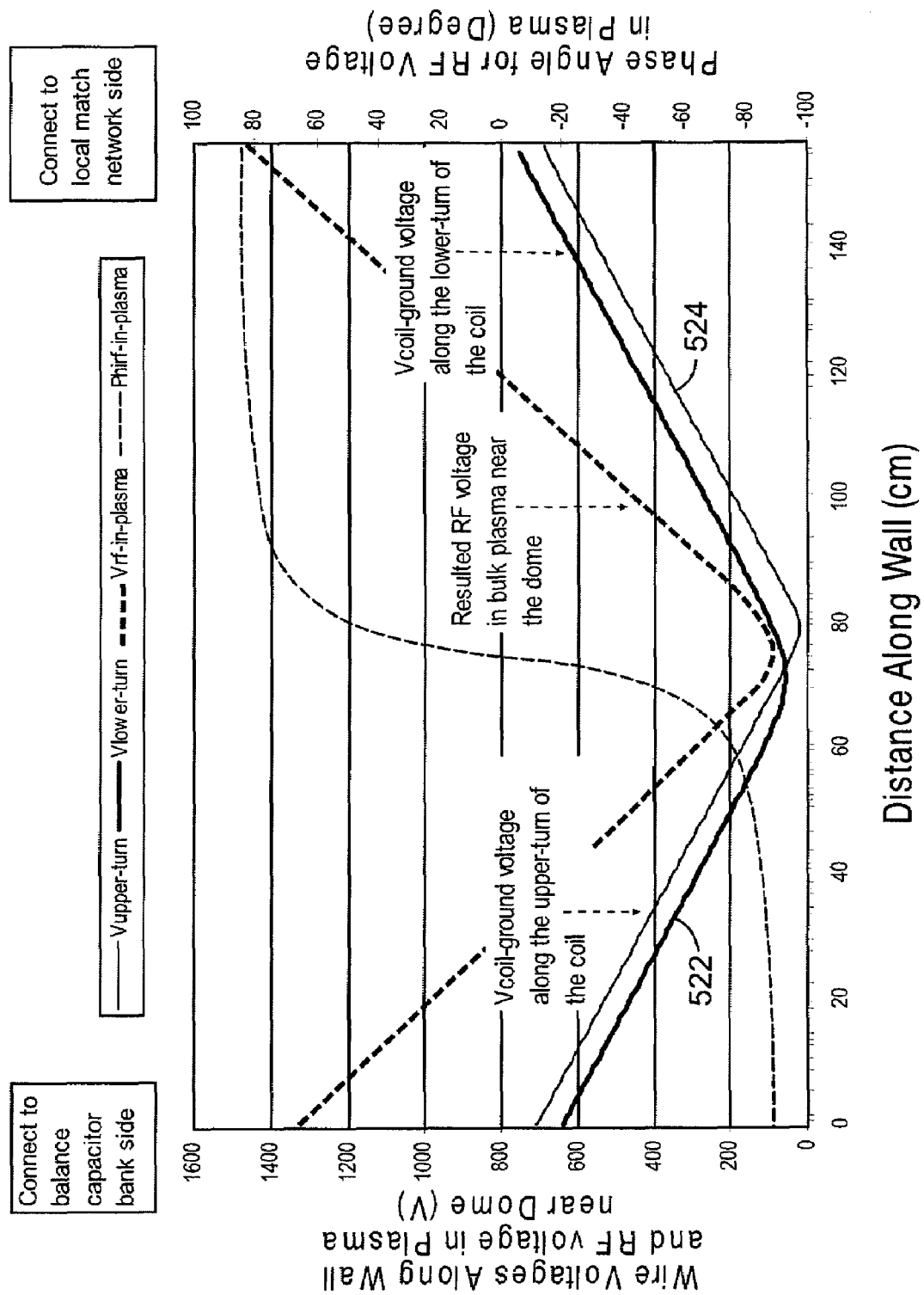
FIG. 5B shows a plot of side coil voltage (coil to ground) and phase angles along the chamber wall for a side coil with an internal balance capacitor as in FIGS. 2B and 5A, according to an embodiment of the present invention.

FIG. 5B shows a plot of side coil voltage (coil to ground) and phase angles along the chamber wall for a side coil with an internal balance capacitor as in FIGS. 2B and 5A, according to an embodiment of the present invention. Voltage profile 522 of the bottom turn segment is plotted along the wall of the plasma chamber, along with voltage profile 524 of the top turn coil segment. Although the voltage profiles show reduced peak voltages, the voltage peaks overlap along the wall of the plasma chamber. This overlap of voltage peaks may result in non-uniform effects that can be avoided by using additional internal balance capacitors, for example two internal balance capacitors as described herein. Possible non-uniform effects that may result from the overlapping voltage peaks include non-uniform heating, non-uniform deposition rate, and a non-uniform ion bombardment rate along the chamber wall. The extent of such non-uniformities, if any, can be readily measured with experiments.

Figure 5C:
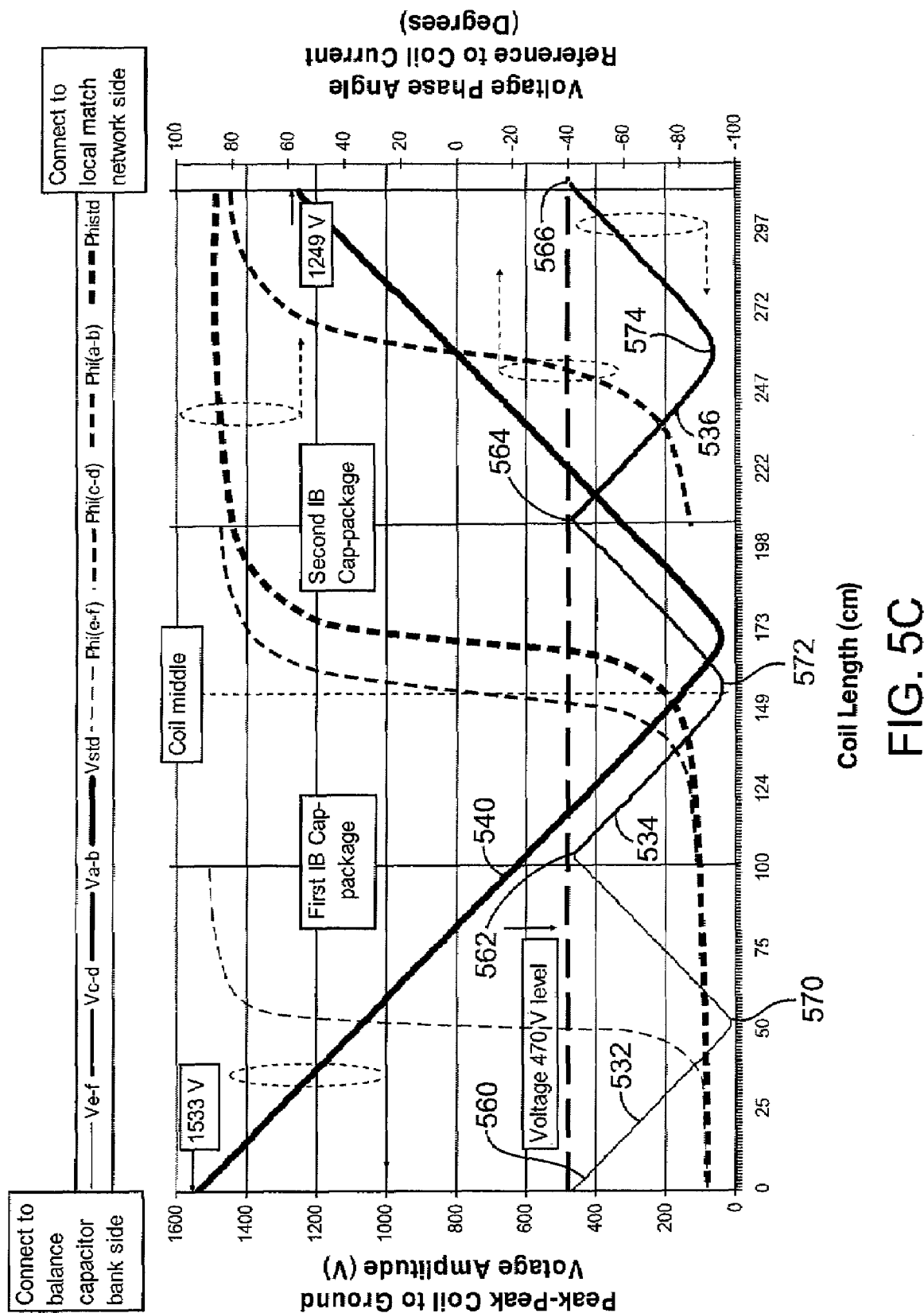
FIG. 5C shows a plot of side coil voltage (coil to ground) and phase angles along the coil length for a side coil with two internal balance capacitors as in FIG. 3A, according to an embodiment of the present invention.

FIG. 5C shows a plot of side coil voltage (coil to ground) and phase angles along the coil length for a side coil with two internal balance capacitors as in FIG. 3A, according to an embodiment of the present invention. A voltage profile 532 is plotted along the first coil segment as described above. A coil length of zero (also noted as "f" in FIG. 3B) corresponds to end 304. The coil length from 0 to approximately 100 cm corresponds to first coil segment 314. The location at 100 cm corresponds to the location of internal balance capacitor 310 (noted as "e" in FIG. 3B). The plot of voltage profile 532 shows a voltage peak 560 at 0 cm of approximately 470 V, a virtual ground 570 at approximately 50 cm, and a voltage peak 562 at 100 cm of approximately 570 V. A voltage profile 534 is plotted along second coil segment 316 of the side coil as described above. Voltage profile 534 is plotted along the side coil from about 100 cm to about 200 cm. The plot of voltage profile 534 shows voltage peak 562 at 100 cm, a virtual ground 572 at about 150 cm, a voltage peaks 564 at 200 cm of approximately 470 V. Voltage profile 536 is plotted along third segment 318 of the side coil as described above. Voltage profile 536 is plotted along the side coil from about 200 cm to about 300 cm. The plot of voltage profile 536 shows voltage peaks 564 at 200 cm, a virtual ground 574 at about 250 cm, and a voltage peak 566 at 300 cm of approximately 470 V. For comparison, a voltage profile 540 is plotted for the side coil without the internal balance capacitor. Voltage profile 540 shows a virtual ground near the center of the coil at about 170 cm and peak voltages of approximately 1530 V and 1250 V. Thus, the simulation shows that two internal balance capacitors used with three coil segments decreases the voltage by about a factor of 0.33 to about 33% of the voltage without the internal balance capacitors.

Figure 5D:
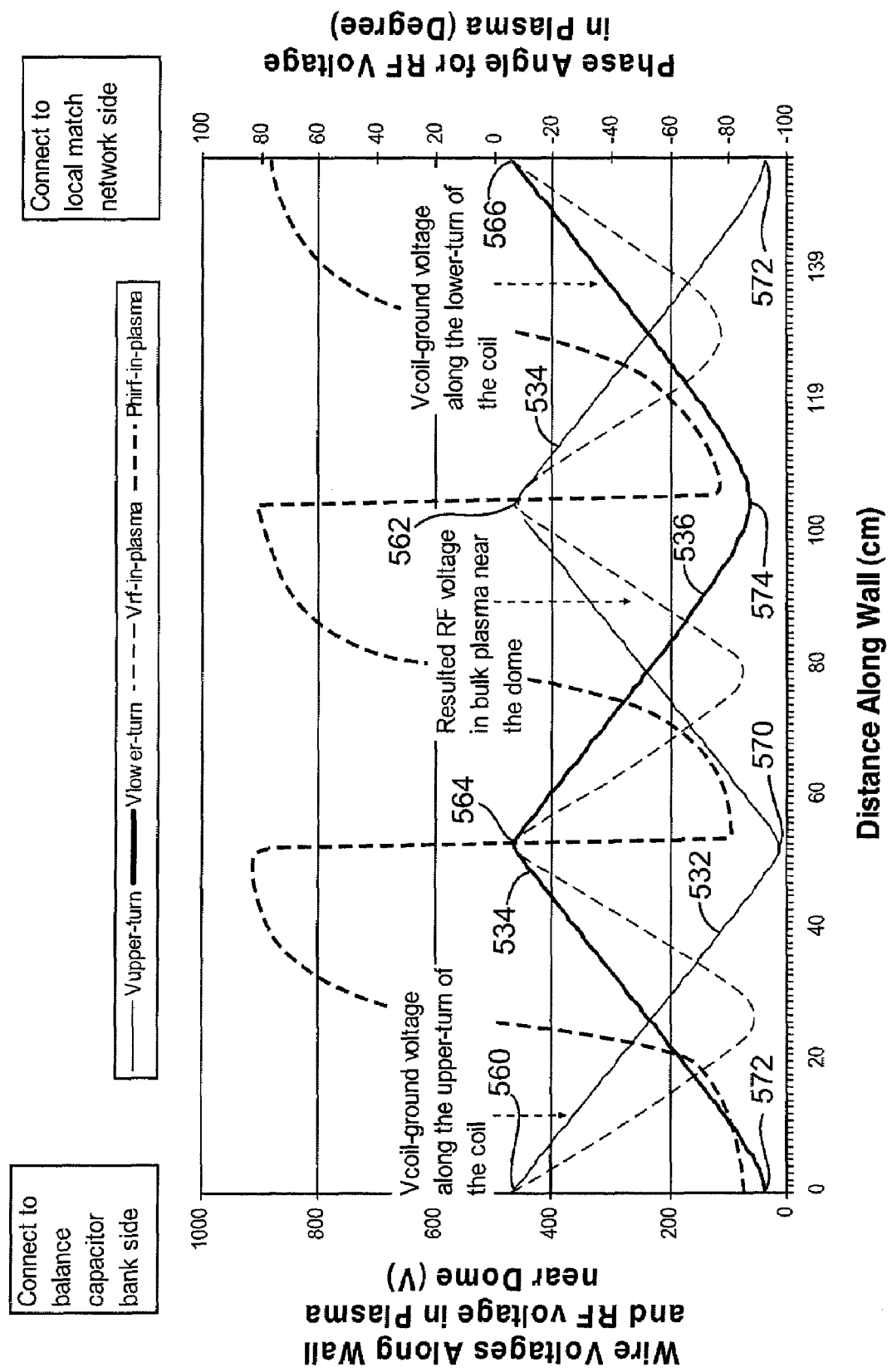
FIG. 5D shows a plot of side coil voltage (coil to ground) and phase angles along chamber wall for a side coil with an internal balance capacitor as in FIGS. 3A and 5C, according to an embodiment of the present invention.

FIG. 5D shows a plot of side coil voltage (coil to ground) and phase angles along chamber wall for a side coil with an internal balance capacitor as in FIGS. 3A and 5C, according to an embodiment of the present invention. The voltage profiles are shown for the upper and lower turns of the side coil along the wall of the ICP chamber. The voltage profile for the upper turn includes voltage profile 532 of the first coil segment and part of voltage profile 534 of the second coil segment. The voltage profile of the lower turn includes part of voltage profile 534 of the second coil segment and voltage profile 536 of the third coil segment. The voltage peak of the upper turn of the side coil is substantially aligned with the virtual grounds of the lower turn of the side coil, and the voltage peak of the lower turn of the side coil is substantially aligned with the virtual ground of the upper turn of the side coil. For example, voltage peak 564 is aligned with virtual ground 570, and voltage peak 562 is aligned with virtual ground 574. This alignment of the voltage peaks with the virtual grounds can provide uniform plasma effects may avoid non-uniformities associated with alignment of the voltage peaks. Possible uniform effects that may be provided with alignment of the voltage peaks with the virtual grounds include uniform heating, uniform deposition rate and uniform ion bombardment rate along the chamber wall. The extent of such uniformities can be readily measured with experiments.

Figure 6A:
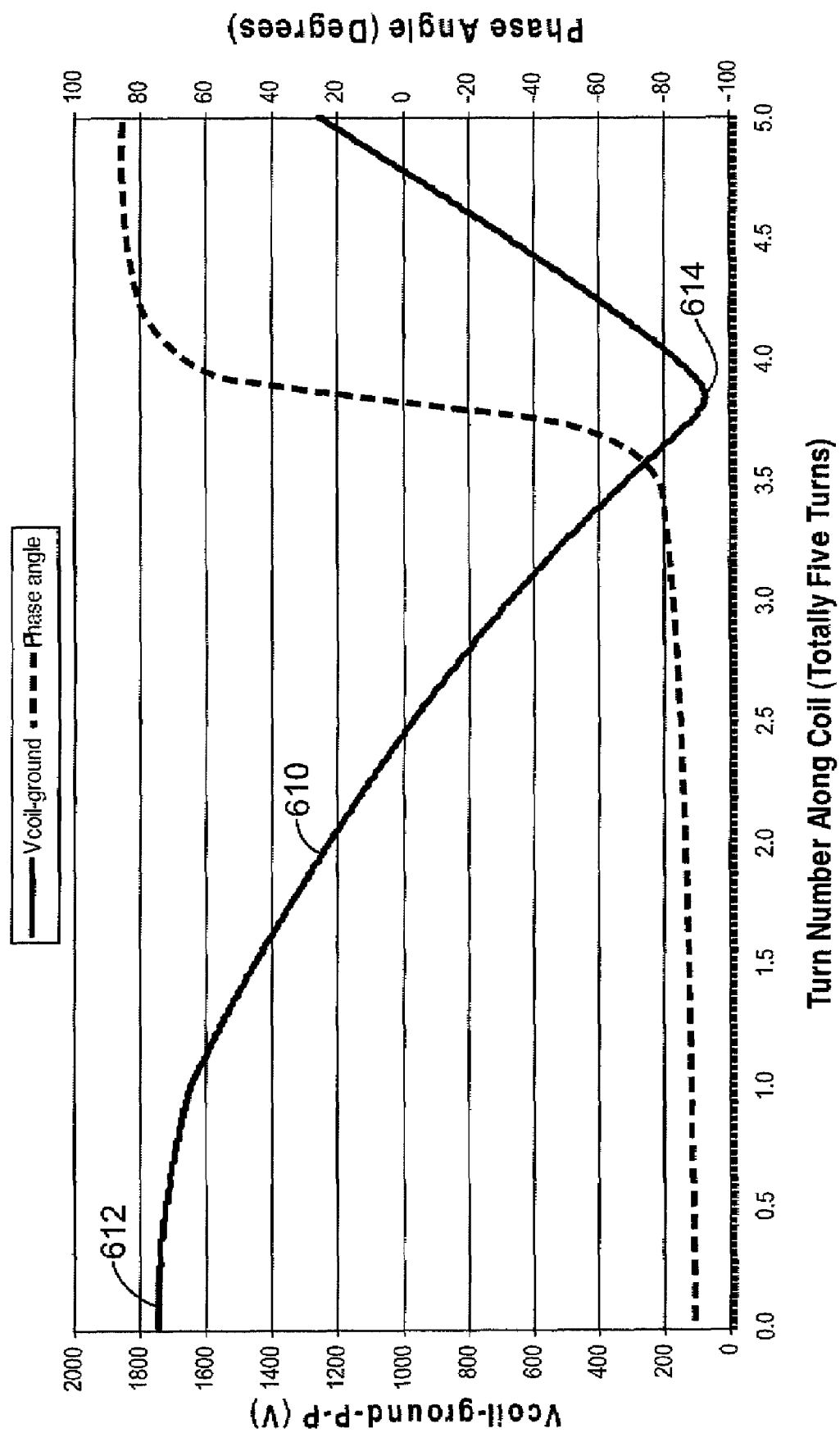
FIG. 6A shows a plot of top coil voltage (coil to ground) and phase angles along the coil turns for a top coil suitable for incorporation of internal balance capacitors as in FIGS. 4A and 4B, according to an embodiment of the present invention.

FIG. 6A shows a plot of top coil voltage (coil to ground) and phase angles along the coil turns for a top coil suitable for incorporation of internal balance capacitors as in FIGS. 4A and 4B, according to an embodiment of the present invention. A voltage profile 610 includes a virtual ground 614 at about turn 3.7, and a voltage peak 612 near turn zero which corresponds to the inner terminal of the top coil as described above. Voltage peak 612 corresponds to a voltage of about 1,700 V. Virtual ground 614 is provided by the external balance capacitor as described above.

Figure 6B:
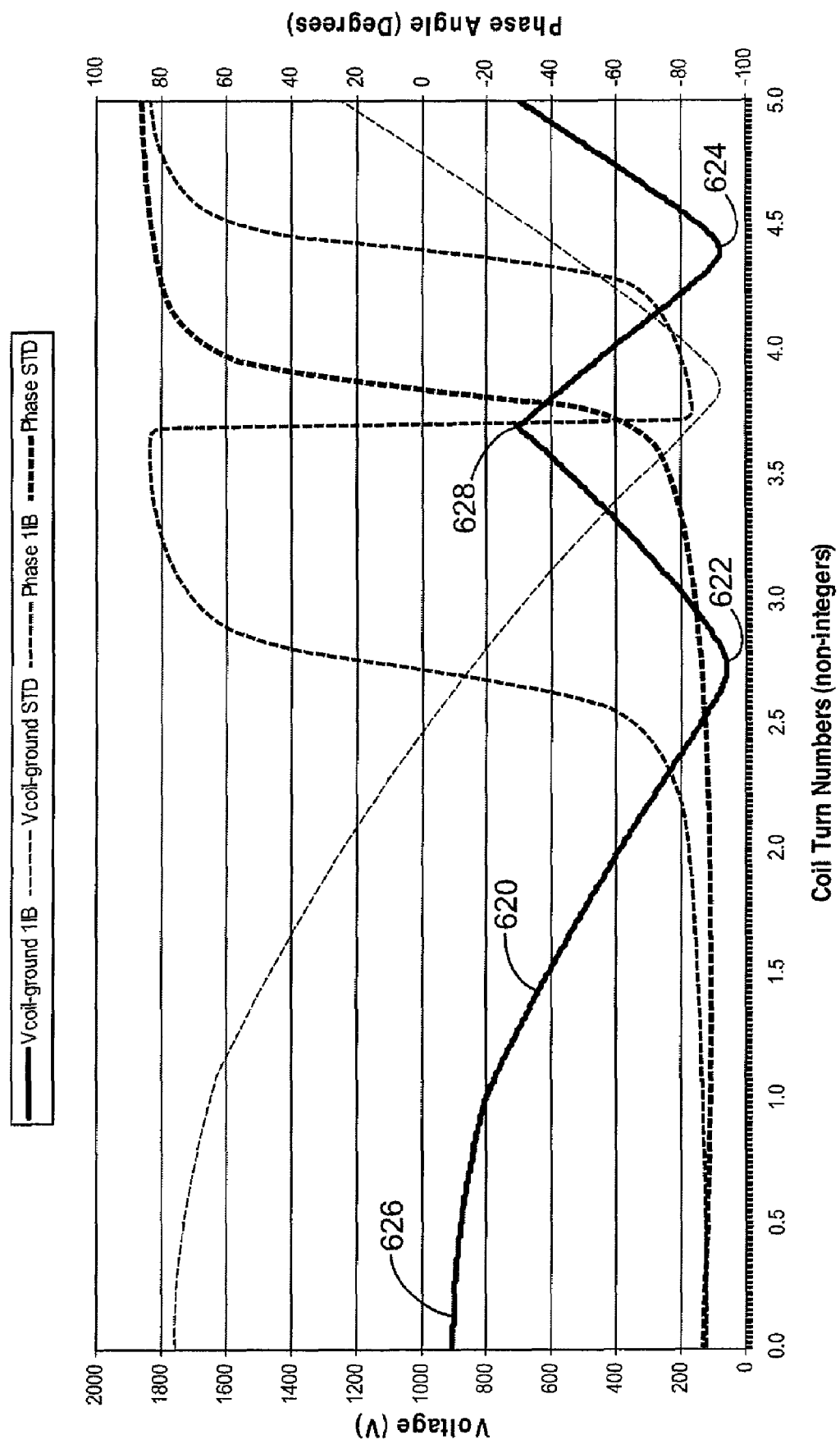
FIG. 6B shows a plot of side coil voltage (coil to ground) and phase angles along the coil turns for a top coil with an internal balance capacitor as in FIG. 4C, according to an embodiment of the present invention.

FIG. 6B shows a plot of side coil voltage (coil to ground) and phase angles along the coil turns for a top coil with an internal balance capacitor as in FIG. 4C, according to an embodiment of the present invention. A voltage profile 620 includes a virtual ground 622 located near turn 2.7 and a virtual ground 624 located near turn 4.4. Voltage profile 620 includes a voltage peak 626 near turn 0 at the inner end of the top coil and a voltage peak 628 located near turn 3.7. Voltage peak 626 corresponds to a voltage of about 900 V and is decreased by a factor of 2 to about half of the voltage without the internal balance capacitor.

Figure 6C:
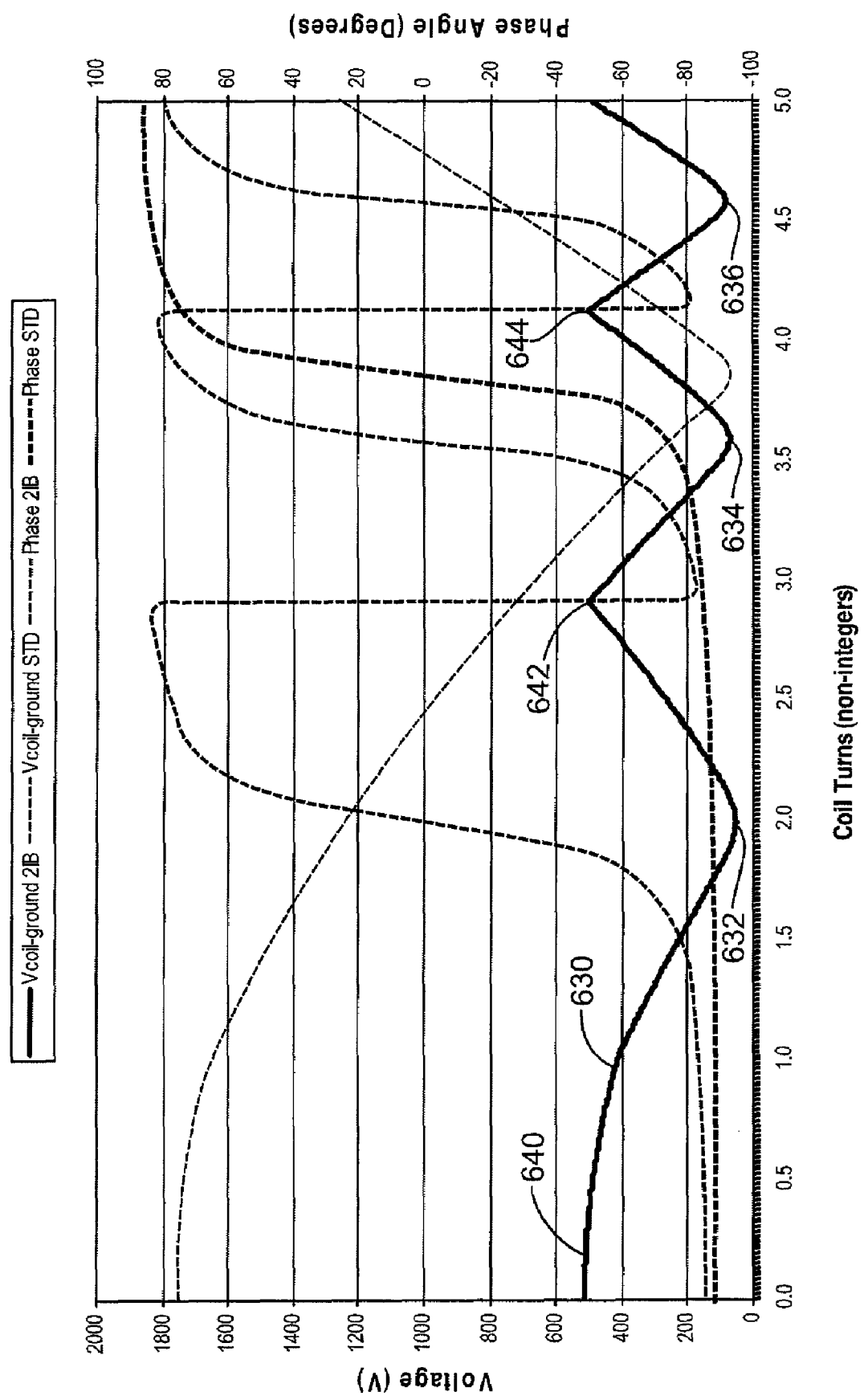
FIG. 6C shows a plot of side coil voltage (coil to ground) and phase angles along the coil turns for a top coil with two internal balance capacitors as in FIG. 4D, according to an embodiment of the present invention.

FIG. 6C shows a plot of side coil voltage (coil to ground) and phase angles along the coil turns for a top coil with two internal balance capacitors as in FIG. 4D, according to an embodiment of the present invention. A voltage profile 630 includes a virtual ground 632 located near turn 2.0, a virtual ground 634 located near turn 3.5 and a virtual ground 636 located near turn 4.5. Voltage profile 630 includes a voltage peak 640 located near turn 0 at the inner end of the top coil, a voltage peak 642 locate near turn 3.0 and a voltage peak 644 located near turn 4.1. The voltage peaks have voltages of approximately 500 V, so that the voltage is decreased by a factor of 0.33 to about one third of the voltage without the internal balance capacitors.

Figure 7:
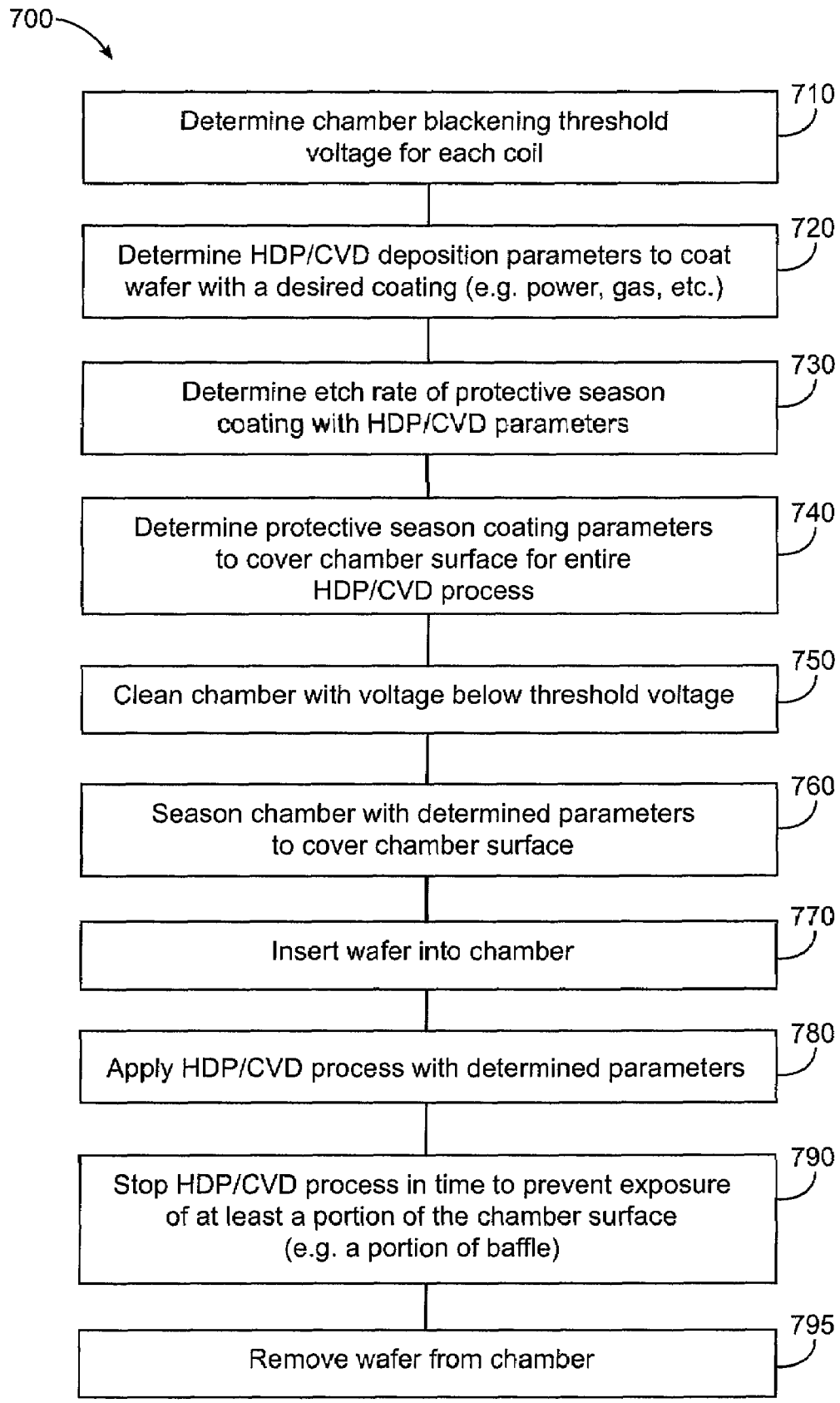
FIG. 7 shows a method of processing a wafer according to an embodiment of the present invention.

FIG. 7 shows a method 700 of processing a wafer according to an embodiment of the present invention. Method 700 provides a process with low contamination and long chamber life. Method 700 can be implemented with a system controller as described above. A step 710 determines a chamber blackening threshold voltage for each coil, for example the top coil and side coil. This threshold voltage can be determined experimentally using different voltages and prolonged exposure to determine a voltage below which chamber blackening near each coil, for example the chamber dome and/or side walls near the top and side coils as described above. Once this voltage has been determined on one chamber with one set of coils, this threshold voltage and process can be applied to similar chambers. A step 720 determines HDP/CVD deposition process parameters to coat to a wafer with a desired coating with coil voltages below the threshold. The deposition process parameters include power level, gases and can include voltages to the coils. A step 730 determines an etch rate of a protective season coating, for example $SiO_2$, with the determined HDP/CVD parameters. The etch rate need not be determined for the entire chamber and may be determined for only a portion and/or a structure of the chamber that is sensitive to etching of the protective season coating, for example the gas distributor baffle, the side wall and/or the top dome. In specific embodiments, the etch rate of the season coating disposed on surface of a structure inside the chamber can be related to an electric field that passes through the structure, for example related to an electric field that passes through a gas baffle as described above. The etch rate of the protective season coating on the surface of the internal structure can be determined experimentally by monitoring contamination from the structure with the electric field passing therethrough in response to dielectric layer deposition times and/or chamber season times. In many embodiments, the etch rate of the protective season coating corresponds to the electric field that passes through the structure, for example the electric field that passes through the gas baffle. A step 740 determines parameters used to apply the protective season coating. Example parameters include gases, such as $SiH_4$ and $O_2$, power level, and process duration. A step 750 cleans the chamber with the coil voltage below the threshold, for example with clean gas. A step 760 seasons the chamber with the parameters determined in step 740 to cover the chamber surface with the protective season coating. Step 740 is performed before step 760 so that step 760 applies pre-determined parameters to season the chamber. Alternatively, step 740 can be performed at least partially during step 760. A step 770 inserts a wafer into the chamber for processing. A step 780 applies the HDP/CVD process to the wafer with the parameters determined in step 720. Step 780 is performed before step 720 so that step 780 uses at least some pre-determined parameters, for example power level. A step 790 stops the HDP/CVD process in time to prevent exposure of at least a portion of the chamber surface (e.g. a portion of the baffle) during the HDP/CVD process, thereby reducing contamination to the chamber. A step 795 removes the wafer from the chamber. In many embodiments, a processor as described above can be used and/or adapted to control each of the steps of method 700, for example the processor can simultaneously control step 710, step 720, step 730, step 740, step 750, step 760, step 770, step 780, step 790 and step 795.

It should be appreciated that the specific steps illustrated in FIG. 7 provide a particular method of processing a wafer according to an embodiment of the present invention. Other sequences of steps may also be performed according to alternative embodiments. For example, alternative embodiments of the present invention may perform the steps outlined above in a different order. Also, many of the steps may be performed at the same time and at least partially overlap with respect to timing of the steps. Moreover, the individual steps illustrated in FIG. 7 may include multiple sub-steps that may be performed in various sequences as appropriate to the individual step. Furthermore, additional steps may be added or removed depending on the particular applications. One of ordinary skill in the art will recognize many variations, modifications, and alternatives.

Figure 8:
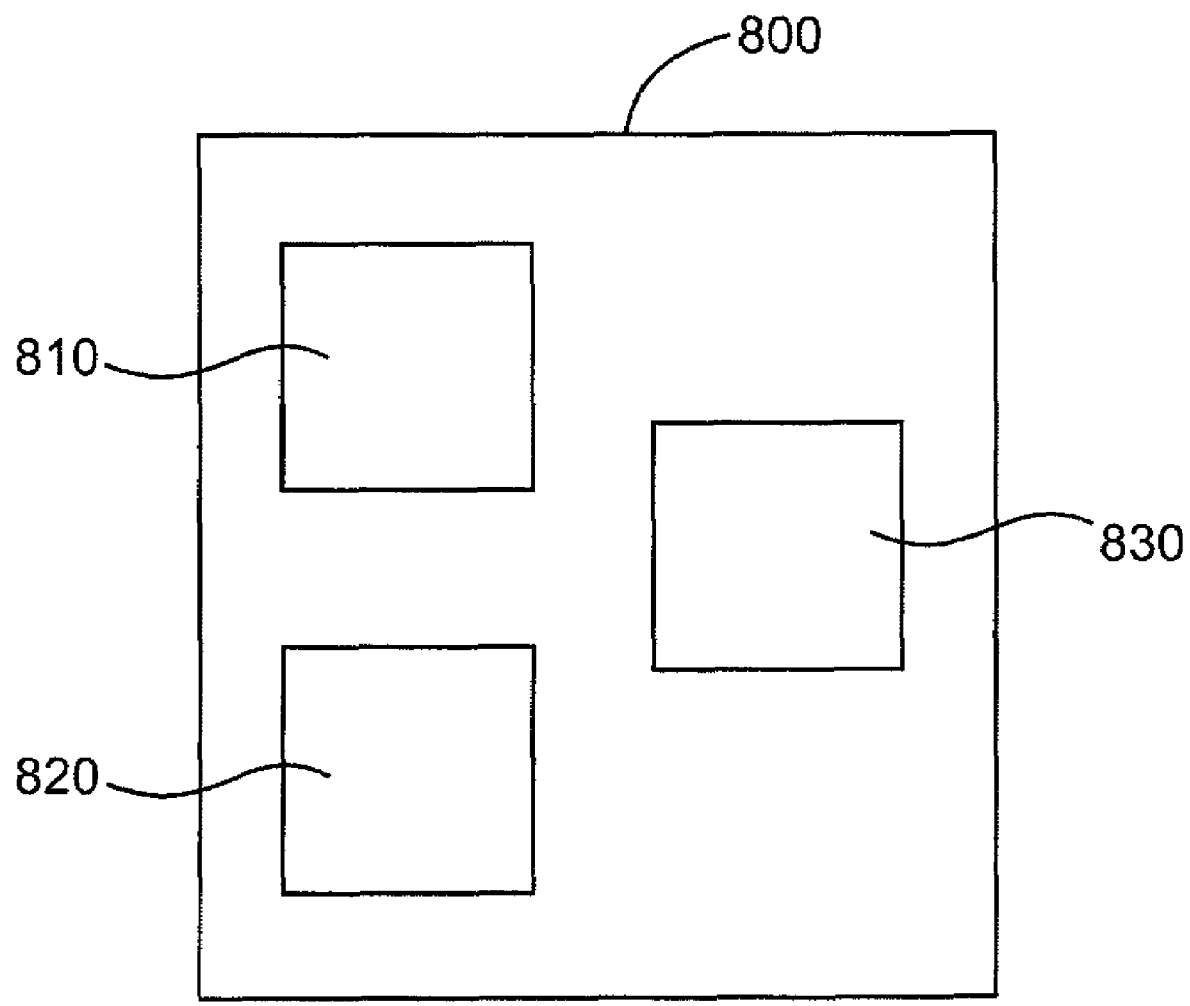
FIG. 8 shows a kit to provide a coil with an internal balance capacitor, according to an embodiment of the present invention.

FIG. 8 shows a kit 800 to provide a coil with an internal balance capacitor, according to an embodiment of the present invention. Kit 800 includes coil segments 810 and at least one internal balance capacitor 820 as described above. The coil segments and the at least one internal balance capacitor can be adapted to provide alignment of voltage peaks with virtual grounds along the coil segments, and uniform effects as described above, once the kit has been assembled. Kit 800 also includes instructions 830 that explain assembly of the kit components.

Having fully described several embodiments of the present invention, many other equivalents or alternative embodiments of the present invention will be apparent to those skilled in the art. The scope of the invention should, therefore, be determined not with reference to the above description, but instead should be determined with reference to the appended claims along with their full scope of equivalents.

What is claimed is:

1. A method of depositing a layer with an HDP/CVD semiconductor processing chamber, the method comprising:
    determining a value of at least one HDP/CVD deposition parameter to deposit the layer on a semiconductor wafer;
    determining an etch rate of a protective chamber coating disposed on a surface of a structure inside the chamber based on the value of the HDP/CVD deposition parameter;
    determining a value of a chamber season parameter to form the protective chamber coating on the surface of the structure inside the chamber in response to the etch rate;
    seasoning the chamber to form the protective coating on the surface of the structure inside the chamber based on the value of the chamber season parameter;
    inserting a semiconductor wafer into the chamber;
    applying the HDP/CVD process to deposit the layer on the wafer based on the value of the HDP/CVD deposition parameter, wherein the protective coating is etched from the surface of the structure inside the chamber when the layer is deposited on the wafer;
    stopping the HDP/CVD process before the protective coating is removed from the surface and a portion of the surface of the structure is exposed; and
    removing the wafer from the chamber.

2. The method of claim 1 wherein the etch rate of the protective coating corresponds to an electric field that passes through the structure.

3. The method of claim 1 wherein the HDP/CVD process comprises a high power process and the HDP/CVD process is applied with a coil voltage under 1 kV.

4. The method of claim 1 wherein the HDP/CVD process comprises a high power process and the HDP/CVD process is applied below a blackening threshold of at least one of a dome or a side wall that defines the chamber.

5. The method of claim 1 wherein the chamber season parameter comprises a time the chamber is seasoned to provide the protective coating.

6. The method of claim 1 wherein the HDP/CVD deposition parameter comprises an HDP/CVD power level.

7. The method of claim 1 wherein the structure comprises a baffle and the surface comprises a surface of the baffle such that the coating is etched from the surface of the baffle when the layer is deposited on the substrate with the HDP/CVD process and wherein the HPD/CVD process is stopped before the surface of the baffle is exposed by the HDP/CVD process.

* * * * *